US012549149B1

(12) United States Patent
Dueweke

(10) Patent No.: US 12,549,149 B1
(45) Date of Patent: Feb. 10, 2026

(54) TUNABLE FILTERS AND ANTENNAS, AND METHODS OF MAKING AND USING THE SAME

(71) Applicant: Michael J. Dueweke, Campbell, CA (US)

(72) Inventor: Michael J. Dueweke, Campbell, CA (US)

( * ) Notice: Subject to any disclaimer, the term of this patent is extended or adjusted under 35 U.S.C. 154(b) by 536 days.

(21) Appl. No.: 18/069,389

(22) Filed: Dec. 21, 2022

Related U.S. Application Data

(60) Provisional application No. 63/296,103, filed on Jan. 3, 2022.

(51) Int. Cl.

| | |
|---|---|
| ***H01P 1/203*** | (2006.01) |
| ***H01Q 7/00*** | (2006.01) |
| ***H01Q 9/04*** | (2006.01) |
| ***H03H 7/01*** | (2006.01) |

(52) U.S. Cl.
CPC ........... *H03H 7/0153* (2013.01); *H01P 1/203* (2013.01); *H01Q 7/005* (2013.01); *H01Q 9/0442* (2013.01); *H03H 7/0115* (2013.01)

(58) Field of Classification Search
CPC .. H01P 1/203; H01P 1/20354; H01P 1/20363; H01P 1/20372; H01P 1/20381; H01Q 9/047; H01Q 9/04; H01Q 9/065; H01Q 13/206; H01Q 1/38
See application file for complete search history.

(56) References Cited

U.S. PATENT DOCUMENTS 10,044,380 B1 * 8/2018 Broyde .................... H04B 1/04
2002/0050872 A1 * 5/2002 Terashima ............. H01P 1/203 333/205
2015/0123852 A1 * 5/2015 Yamagajo ............ H01Q 13/206 343/700 MS
2016/0268663 A1 * 9/2016 Tanaka ................ H01P 1/20381

* cited by examiner

*Primary Examiner* — Stephen E. Jones
(74) *Attorney, Agent, or Firm* — Central California IP Group, P.C.; Andrew D. Fortney

(57) ABSTRACT

Tunable electromagnetic filters and antennas are described. The tunable electromagnetic filters and tunable antennas comprise a transmission line or antenna feed line, an isolated conductor or semiconductor material, and a support structure supporting a mechanical or electromagnetic actuator. The mechanical or electromagnetic actuator moves the isolated conductor or semiconductor material, and tunes the resonance frequency of an electromagnetic resonator.

20 Claims, 29 Drawing Sheets

TUNABLE FILTERS AND ANTENNAS, AND METHODS OF MAKING AND USING THE SAME

CROSS REFERENCE TO RELATED APPLICATION(S)

This application claims the benefit of U.S. Provisional Patent Application No. 63/296,103, filed on Jan. 3, 2022, incorporated herein by reference as if fully set forth herein.

FIELD OF THE INVENTION

The present invention generally relates to the field of electromagnetic filters used in wireless communication systems.

DISCUSSION OF THE BACKGROUND

Microwave and millimeter wave filter demand continues to increase with 5G and 6G Wifi, mobile phone, IoT and autonomous driving as some applications for such filters. Much of current existing wireless technology relies on static or fixed frequency filters provided by bulk acoustic wave (BAW) and surface acoustic wave (SAW) filter technology. A separate fixed filter is needed for each frequency band used, necessitating a significant number of discrete filter components as the number of frequency channels increases.

Tunable filters provide the ability to adjust a filter among different frequency bands using the same component, and can potentially save size, weight, power, and cost of a filtering solution. Some tunable millimeter wave filters exist in the market, but they are typically either very expensive and slow tuning cavity filters or switched filter banks that have problems with linearity, insertion loss, and power handling. Bulk acoustic wave (BAW) filters rely on device thinness to set the filter frequency, but are difficult to scale to millimeter wave frequencies and are not readily tunable.

What is needed is a compact, low cost, low power, high linearity, high power handling and low-loss tunable filtering solution. Metamaterials including split ring resonators and complementary split ring resonators coupled by MEMS technology offer the potential to meet these demands.

This “Discussion of the Background” section is provided for background information only. The statements in this “Discussion of the Background” are not an admission that the subject matter disclosed in this “Discussion of the Background” section constitutes prior art to the present disclosure, and no part of this “Discussion of the Background” section may be used as an admission that any part of this application, including this “Discussion of the Background” section, constitutes prior art to the present disclosure.

SUMMARY OF THE INVENTION

The present invention provides an electromagnetic filter and antenna architecture which consumes little power and provides good isolation and high power handling, while avoiding reliability issues that have plagued technologies using contacting surfaces. The present invention also provides tunability of antennas to increase isolation or improve signal gain at desired frequencies.

Tunable electromagnetic filters demonstrated in research typically have a very small tuning range, are limited to low frequencies, have low power handling capability, and/or suffer insertion losses due to shunt configuration of tuning capacitors. The present technology allows tuning of series capacitors and resonators along the transmission line as well as in shunt configuration, allowing a greater flexibility in tuning filter performance.

Thus, embodiments of the present invention relate to a tunable electromagnetic filter, comprising at least one conducting transmission line, at least one input port, at least one output port, at least one electromagnetic resonator, at least one mechanical actuator tuning element comprising an electrically isolated conductor or semiconductor material that couples capacitively or inductively to the at least one electromagnetic resonator, and a mechanical support structure supporting the at least one mechanical actuator tuning element and preventing the at least one mechanical actuator from contacting the at least one electromagnetic resonator.

In at least one embodiment, the electromagnetic resonator (s) comprise a split ring resonator (SRR), a complementary split ring resonator (CSRR), a combline resonator, a hairpin resonator, an edge-coupled resonator, a step impedance resonator, a spur line resonator, or a combination thereof. In at least one other or further embodiment, the one conducting transmission line(s), the electromagnetic resonator(s) or the electrically isolated conductor material comprises a superconducting material.

In at least one embodiment, the mechanical actuator tuning element(s) vary a capacitance or inductance between the isolated conductor or semiconductor material and the at least one electromagnetic resonator by piezoelectric actuation, electrostatic actuation, magnetic actuation, thermal actuation, pneumatic actuation, or hydraulic actuation. In at least one other or further embodiment, the mechanical actuator tuning element(s) have a capacitance or inductance configured (e.g., tuned) to provide a predetermined phase shift or delay of an incoming signal.

In various embodiments, the transmission line(s) are configured to receive an applied signal having a frequency of 1-125 GHz. In other or further embodiments, the mechanical support structure comprises a low-loss substrate, such as a glass, high resistivity silicon, a suspended substrate integrated waveguide, or a low-loss dielectric material (e.g., other than a low-loss glass).

Another aspect of the present disclosure concerns a tunable electromagnetic antenna, comprising a conducting antenna feed line, at least one input or output port, at least one electromagnetic resonator, at least one mechanical actuator tuning element, comprising an electrically isolated conductor or semiconductor material that couples capacitively or inductively to the electromagnetic resonator(s), and a mechanical support structure that supports the mechanical actuator tuning element(s) and prevents a corresponding mechanical actuator (e.g., connected or coupled to one of the at least one mechanical actuator tuning element) from contacting the electromagnetic resonator(s).

As for the tunable electromagnetic filter, in at least one embodiment, the electromagnetic resonator(s) comprises a split ring resonator (SRR), a complementary split ring resonator (CSRR), a combline resonator, a hairpin resonator, an edge-coupled resonator, a step impedance resonator, a spur line resonator, or a combination thereof. Similarly, in the present antenna, the conducting transmission line(s), the electromagnetic resonator(s) or the electrically isolated conductor material may comprise a superconducting material.

As for the tunable electromagnetic filter, in at least one embodiment, the mechanical actuator tuning element(s) varies a capacitance or inductance between the isolated conductor or semiconductor material and the electromagnetic resonator(s) by piezoelectric actuation, electrostatic actuation, magnetic actuation, thermal actuation, pneumatic actuation, or hydraulic actuation. Similarly, in the present antenna, the mechanical actuator tuning element(s) may have a capacitance or inductance configured to provide a predetermined phase shift or delay of an incoming signal (e.g., on the transmission line[s]). In some embodiments, the present antenna may further comprise the mechanical actuator, tuned (e.g., having a [resonant] frequency controlled) by the corresponding mechanical actuator tuning element.

In another aspect, the present disclosure relates to an array of the present tunable antennas, comprising two or more of the tunable electromagnetic antennas, control circuitry that tunes a frequency or signal phase or delay of the incoming signal, antenna feed lines, and a control line corresponding to each of the tunable electromagnetic antennas. The control line is generally connected to the mechanical actuator.

As for the tunable electromagnetic filter, in various embodiments, the input port(s) or feed line(s) in the present array of tunable antennas are configured to receive an applied signal having a frequency of 1-125 GHz. In other or further embodiments, the mechanical support structure (e.g., in the tunable electromagnetic antenna[s]) comprises a low-loss substrate, such as a glass, high resistivity silicon, a suspended substrate integrated waveguide, or a low-loss dielectric material.

Yet another aspect of the present disclosure relates to a method, comprising receiving an incoming signal on at least one conducting transmission line through an input port; coupling the incoming signal to at least one electromagnetic resonator in electrical communication with the conducting transmission line(s); capacitively or inductively coupling at least one mechanical actuator tuning element to the electromagnetic resonator(s), the mechanical actuator tuning element(s) each comprising an electrically isolated conductor or semiconductor material; preventing a corresponding mechanical actuator (e.g., coupled, connected or corresponding to one or more of the at least one mechanical actuator tuning element) from contacting the electromagnetic resonator(s) with a mechanical support structure that supports the (corresponding) mechanical actuator tuning element, and providing an output signal from the electromagnetic resonator(s) through at least one output port in electrical communication with one or more of the conducting transmission line(s).

As for the tunable filter and the tunable antenna, the electromagnetic resonator may comprise a split ring resonator (SRR), a complementary split ring resonator (CSRR), a combline resonator, a hairpin resonator, an edge-coupled resonator, a step impedance resonator, a spur line resonator, or a combination thereof. In various embodiments, capacitively or inductively coupling the mechanical actuator tuning element(s) to the electromagnetic resonator(s) provides a predetermined phase shift or delay of the incoming signal. In other or further embodiments, capacitively or inductively coupling the mechanical actuator tuning element(s) to the electromagnetic resonator(s) comprises piezoelectrically, electrostatically, magnetically, thermally, pneumatically or hydraulically actuating the mechanical actuator tuning element(s). The incoming signal may have a frequency of 1-125 GHz.

Antennas based on metamaterials can be made smaller than conventional antennas as metamaterial components can resonate with dimensions much smaller than the electromagnetic wavelength transmitted or received. Metamaterial antennas can perform more efficiently than conventional antennas, saving significant power consumption.

The present work can provide tunable antennas to optimize signal transmission and receipt, and also provide filtering within the antenna itself.

The present device can provide both switching and filtering functions within the same device, reducing the number of components needed for microwave and millimeter wave communication.

These and other advantages of the present invention will become readily apparent from the detailed description of various embodiments below.

DETAILED DESCRIPTION

Figure 1:
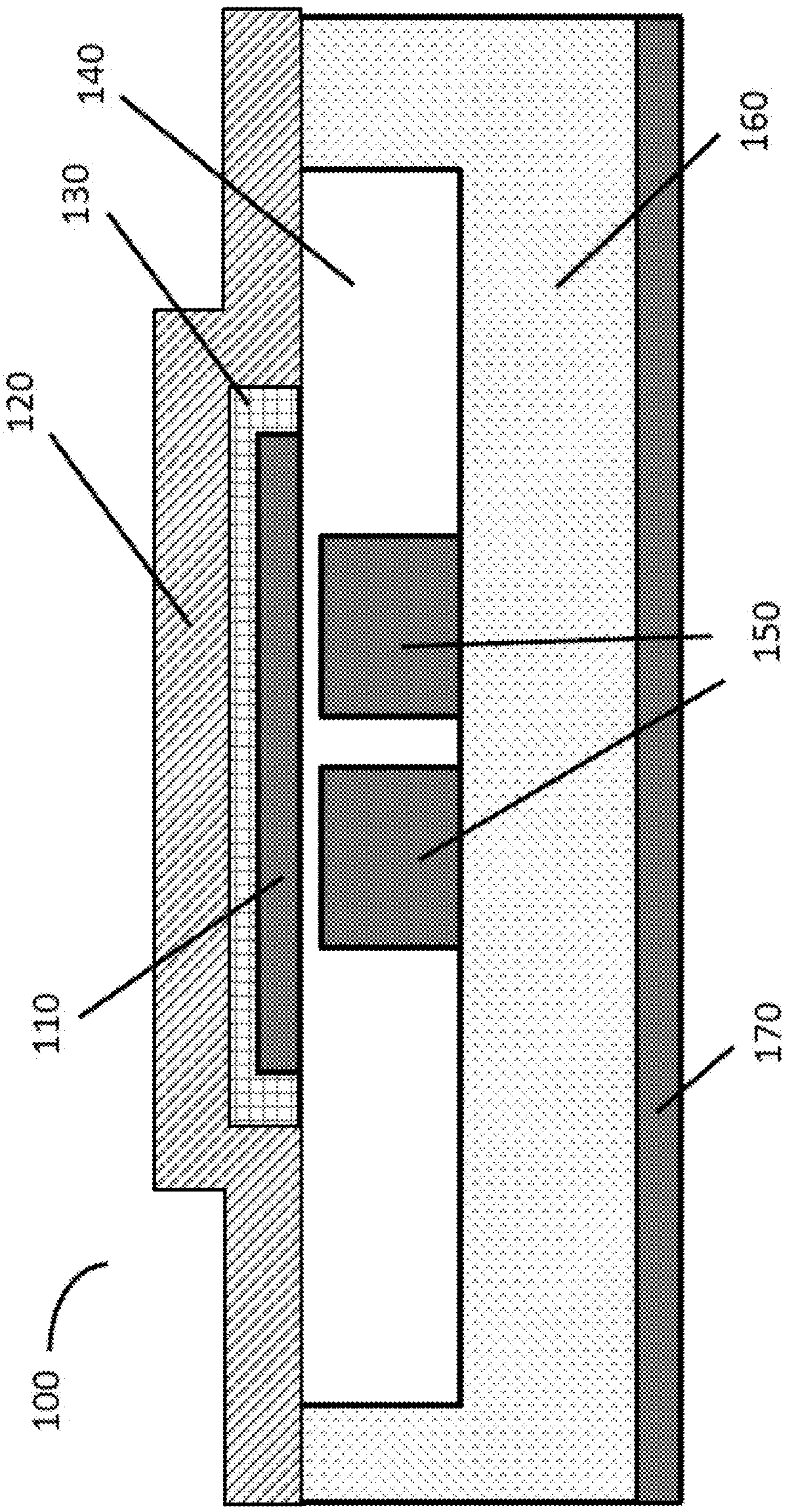
FIG. 1 shows a cross section of a tunable filter resonator element in one embodiment of the present work.

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention. Furthermore, it should be understood that the possible permutations and combinations described herein are not meant to limit the invention. Specifically, variations that are not inconsistent may be mixed and matched as desired.

The technical proposal(s) of embodiments of the present invention will be fully and clearly described in conjunction with the drawings in the following embodiments. It will be understood that the descriptions are not intended to limit the invention to these embodiments. Based on the described embodiments of the present invention, other embodiments can be obtained by one skilled in the art without creative contribution and are in the scope of legal protection given to the present invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise.

The term "length" generally refers to the largest dimension of a given 3-dimensional structure or feature. The term "width" generally refers to the second largest dimension of a given 3-dimensional structure or feature. The term "thickness" generally refers to a smallest dimension of a given 3-dimensional structure or feature. The length and the width, or the width and the thickness, may be the same in some cases. A "major surface" refers to a surface defined by the two largest dimensions of a given structure or feature, which in the case of a structure or feature having a circular surface, may be defined by the radius of the circle.

The terms "lower" and "upper" are used herein as convenient labels for the same or similar structures having a relative position to the other(s) as shown in the drawings, but which can change their relative position(s) depending on the orientation of the apparatus or other structure in the drawing(s). Similarly, the terms "downstream" and "upstream" are convenient labels for relative positions of two or more components of an apparatus or system with respect to the flow of one or more gas(es) or fluid(s) within the apparatus or system. Also, for convenience and simplicity, the terms "connected to," "coupled with," "coupled to," "joined to," "attached to," "fixed to," "affixed to," "in communication with," and grammatical variations thereof may be used interchangeably, and refer to both direct and indirect connections, couplings, joints, attachments and communications (unless the context of its use unambiguously indicates otherwise), but these terms are also generally given their art-recognized meanings.

The invention, in its various aspects, will be explained in greater detail below with regard to exemplary embodiments.

Exemplary Tunable Filters

In accordance with embodiments of the present invention, a tunable filter may comprise at least one transmission line, input and output ports, at least one electromagnetic resonator, and a tunable actuator that couples electromagnetically to at least one electromagnetic resonator. The tunable actuator comprises a support structure, an isolated conductor or semiconductor material, and a capability for actuating movement of the isolated conductor or semiconductor with respect to at least one electromagnetic resonator.

In one embodiment of the present work, an isolated conductor or semiconductor connected to a mechanical actuator couples capacitively to capacitive ends of an electromagnetic resonator. The strength of capacitive coupling depends on the proximity of an isolated conductor or semiconductor to the resonator capacitive ends, lowering the resonant frequency and suppressing resonance with strong coupling and close proximity in an 'off' state, and increasing the resonant frequency and enhancing resonance with weaker coupling and greater distance from the resonator in an 'on' state.

In an off state, according to one embodiment of this work, a conducting portion of a mechanical actuator is held in close proximity to the capacitive ends of a resonator element but does not touch the resonator element. The conducting or semiconductor portion of a mechanical actuator is held in place by a support structure. The conducting or semiconducting portion of the actuator strongly couples capacitively to the capacitive ends of a resonator, effectively providing a conducting bridge across the capacitive ends of the resonator for ac signals. The strong capacitive coupling of the actuator conductor to the resonator lowers the resonant frequency of the resonator and suppresses electromagnetic resonance within the resonator.

In an on state, according to one embodiment of the present work, a conducting portion of a mechanical actuator is moved away from the capacitive ends of a resonator element, decreasing the capacitive coupling between the mechanical actuator conductor and the electromagnetic resonator. With the capacitive coupling between the capacitive ends of the resonator stronger than the capacitive coupling to the actuator conductor or semiconductor, the electromagnetic resonator undergoes electromagnetic oscillations when stimulated with ac signals. In an on state, an electromagnetic resonator stores energy provided by the stimulus and contributes to the filtering function.

In an on state, the actuator conductor or semiconductor does couple some energy between the capacitive ends of an electromagnetic resonator and influences the resonant frequency of the electromagnetic resonator. The frequency of the electromagnetic resonator may be tuned by adjusting the distance of the actuator conductor to the capacitive ends of the electromagnetic resonator while in the on state.

In some embodiments, actuation of an actuator and tuning of impedance may be achieved by structures and methods described in U.S. Pat. No. 10,388,462, the relevant portions of which are incorporated herein by reference.

One advantage of the present invention is that by using an isolated conductor or semiconductor as the coupling and tuning element, series resonators and other series elements may be tuned independently within the filter. Prior art designs used tunable shunt capacitors from the transmission line to ground, or from a resonator to ground, which increase filter loss, degrade the Q of the filter, and limit the maximum filter frequency. The present invention provides more flexibility and control over tuning elements within filters, while providing for higher frequency operation, higher power handling with lower signal loss.

Use of a semiconductor material as the coupling and tuning element can allow for a greater range of capacitive tuning than with a conductor due to the field effect. With strong, close coupling of a semiconductor material to a resonator, electric field effects create an inversion layer within the semiconductor, enhancing charge carrier mobility and signal transmission across the semiconductor and resonator leads. With weak coupling, upon moving the semiconductor away from the resonator, the field effect and carrier mobility is greatly suppressed, resulting in less coupling and a larger difference in capacitance between on and off states than with a conductor. Use of a semiconductor material also allows higher power handling capability of the filter.

In another embodiment of this work, a conducting portion of a mechanical actuator is held in close proximity to an inductive portion of an electromagnetic resonator but does not touch the resonator. The conducting or semiconductor portion of a mechanical actuator is held in place by a support structure. The conducting or semiconducting portion of the actuator couples inductively to a resonator, allowing tuning of the resonant frequency by moving the actuator with respect to the resonator and changing the mutual inductance between the conducting or semiconducting portion of the actuator and the electromagnetic resonator.

In other embodiments, multiple tunable electromagnetic resonator elements may be arranged in series and/or parallel configurations along a transmission line to target tuning to specific frequency ranges or bands. The tunable electromagnetic resonator elements may be combined with other passive or active filter components to achieve target filter performance. Tunable filter elements can be designed such that the notch frequency or minimum transmission in one tuning state corresponds to the resonant frequency and maximum transmission in another tuning state to provide greater isolation of the signal between tuning states. The tunable electromagnetic elements are preferably manufactured on a low-loss substrate including glass, high resistivity silicon, and other low-loss dielectric substrate materials. Tunable resonator elements may be combined with other filter elements to enhance filter performance, such as the use of suspended substrates and substrate integrated waveguide (SIW).

In another embodiment of the present work, tunable filters are configured to provide predetermined signal phase changes at targeted frequencies. Tuning of filter elements also tune the signal phase, allowing selection of a target signal phase from a range of possibilities. Selection of signal phase is useful for beam steering applications in phased array antennas.

FIG. 1 shows a cross section of a tunable filter element 100 in one embodiment of the present work. The tunable filter element 100 comprises an isolated conductor or semiconductor material 110, mechanical actuator 120, electrical isolation layer 130, cavity 140, low-loss substrate 160, electrical ground plane 170 and shows a cross section of the capacitive ends of an electromagnetic resonator 150. In one embodiment, the actuator 120 is a piezoelectric material which moves in response to an applied electric voltage, not shown. In another embodiment the actuator 120 is a microelectromechanical (MEMS) support structure actuated electrostatically. Additional implementations of the actuator 120 include magnetic actuation and thermal activation. In one embodiment, the electrical isolation layer 130 comprises a deposited oxide.

Figure 2:
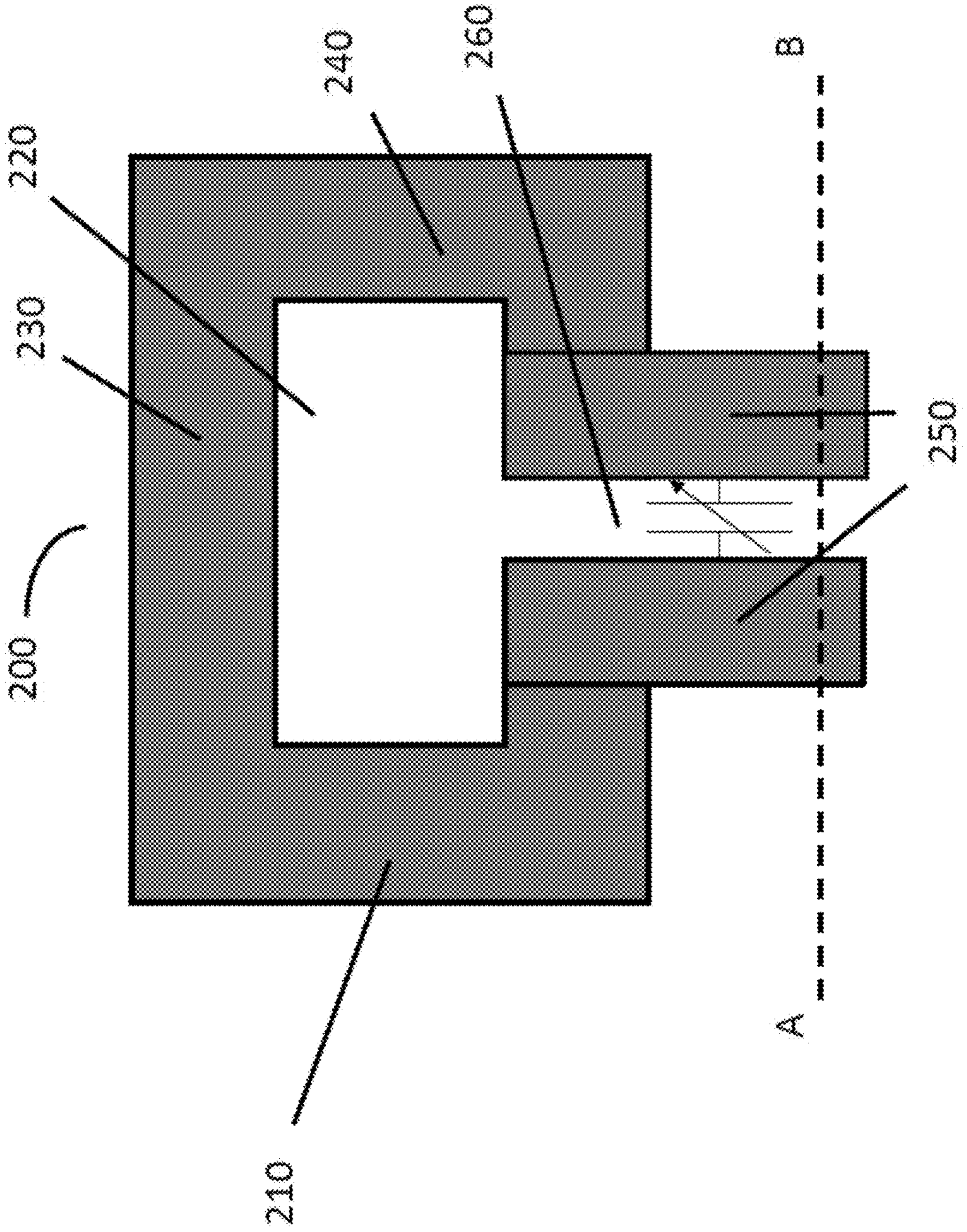
FIG. 2 shows a top view of an electromagnetic resonator in one embodiment of the present work.

FIG. 2 shows a top-down view of an electromagnetic resonator element 200, comprising a (tunable) split ring resonator (SRR). The split ring resonator 200 is made from conducting material 210, in a preferred embodiment a high conductivity metal including copper, silver, gold, platinum or superconducting material. The split ring resonator shown includes an air gap 220 with surrounding conducting loop 210, 230, 240 that is referred to as the inductive portion of the electromagnetic resonator. The example is provided for illustration only, as many variations of electromagnetic resonators may be provided and included within the scope of the present work. The dotted line labeled A-B represents a cross section through the capacitive ends 250 of the split ring resonator 200, and corresponds to the cross-sectional view of the resonator ends in FIG. 1. The tunable capacitor symbol 260 between the narrow capacitive ends of the resonator depicts the function of the tunable actuator element to alter the capacitance between the resonator ends and change the resonant frequency of the resonator.

Figure 3:
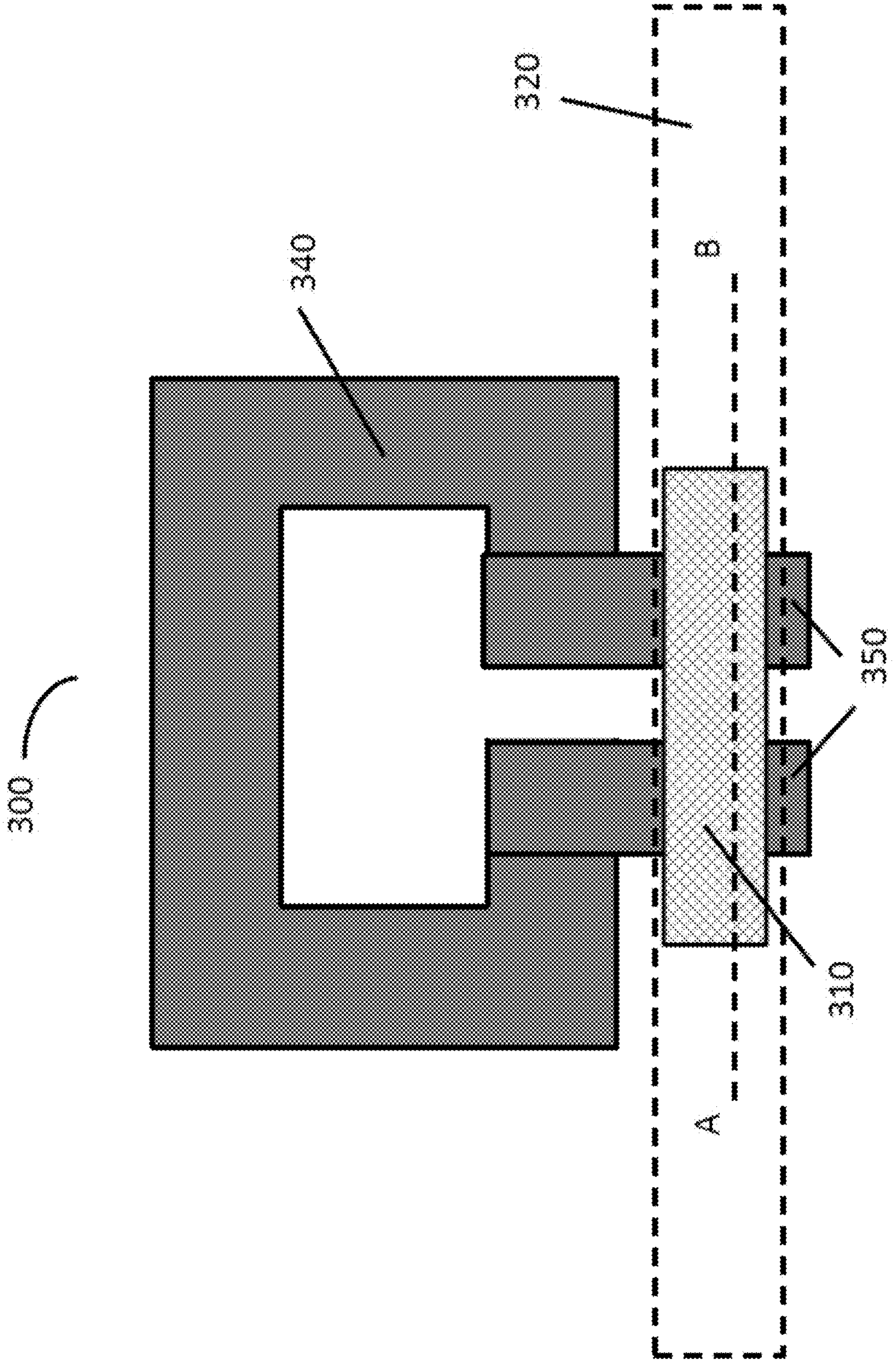
FIG. 3 shows a top view of an electromagnetic resonator and tuning actuator in one embodiment of the present work.

FIG. 3 shows a top-down view of a tunable electromagnetic split ring resonator element (SRR) 300, corresponding to the embodiment shown in FIG. 1. The dotted line labeled A-B represents a cross section through the capacitive ends 350 of the split ring resonator 300, and corresponds to the cross-sectional view of the resonator ends in FIG. 1. An isolated conductor or semiconductor material 310 bridges an air gap and the capacitive ends 350 of the split ring resonator 300. The actuator 320 is connected to, and moves the isolated conductor or semiconductor material 310 upon actuation. The inductive portion of the split ring electromagnetic resonator 300 is depicted as 340.

Figure 4:
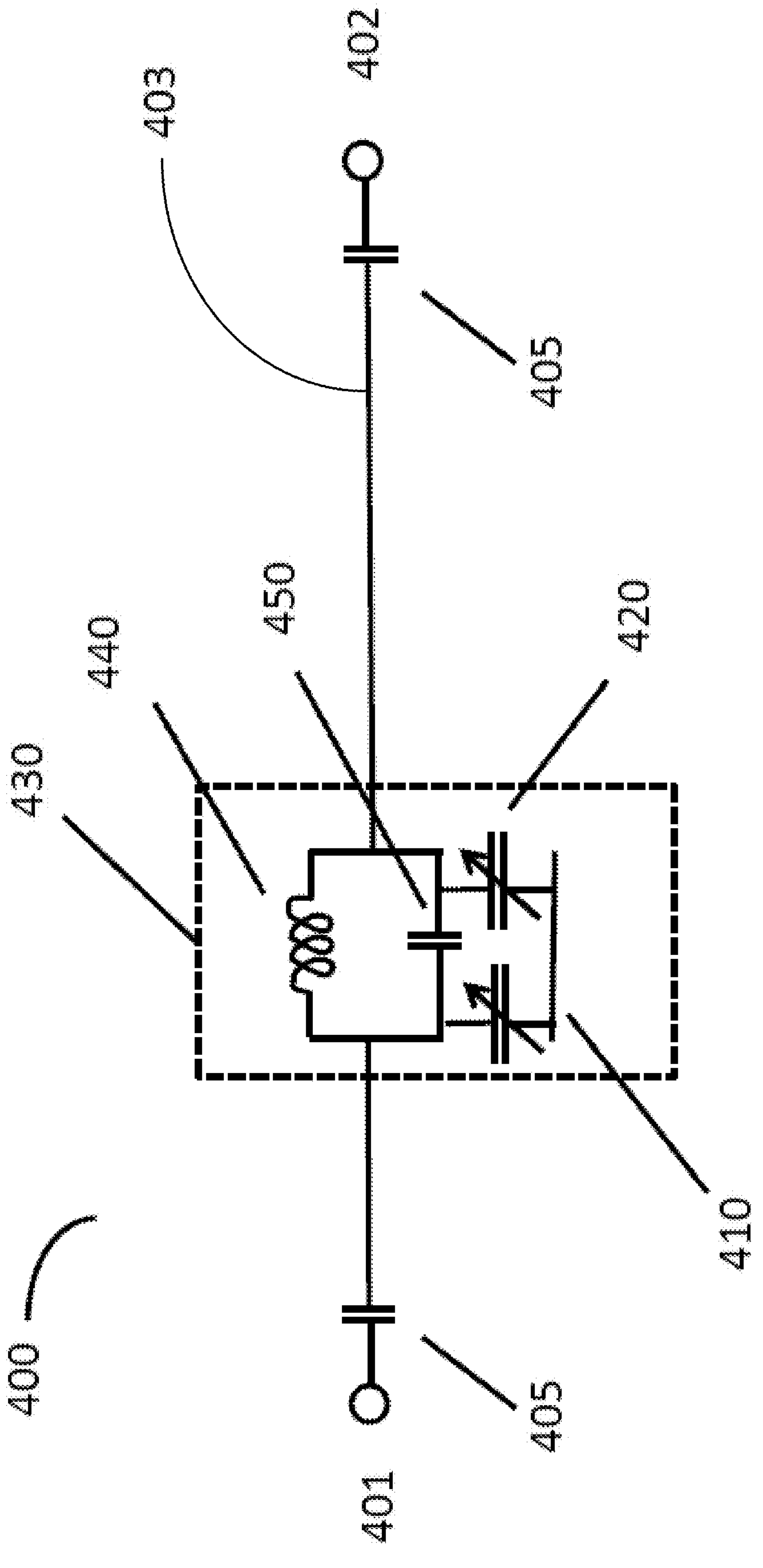
FIG. 4 shows a schematic of a tunable filter resonator element in series with a transmission line in one embodiment of this work.

FIG. 4 shows a schematic 400 of a tunable filter element 430 connected to a transmission line 403 to form a tunable filter. The transmission line 403 has an input port 401, output port 402, and in general contains other passive filter elements, represented here by DC blocking capacitors 405. The electromagnetic resonator is indicated by a capacitor 450 and inductor 440 connected in parallel within the transmission line 403. The isolated conductor or semiconductor material is represented as node 410, coupling capacitance across the capacitive ends 450 of the electromagnetic resonator. The variable capacitors 420 represent the tuning of the actuator which moves the isolated conductor or semiconductor with respect to the capacitive ends of the resonator 450 in one embodiment. The transmission line 403 is shown with a single input and output port, but may in general include multiple inputs and outputs with branching or merging segments.

Figure 5:
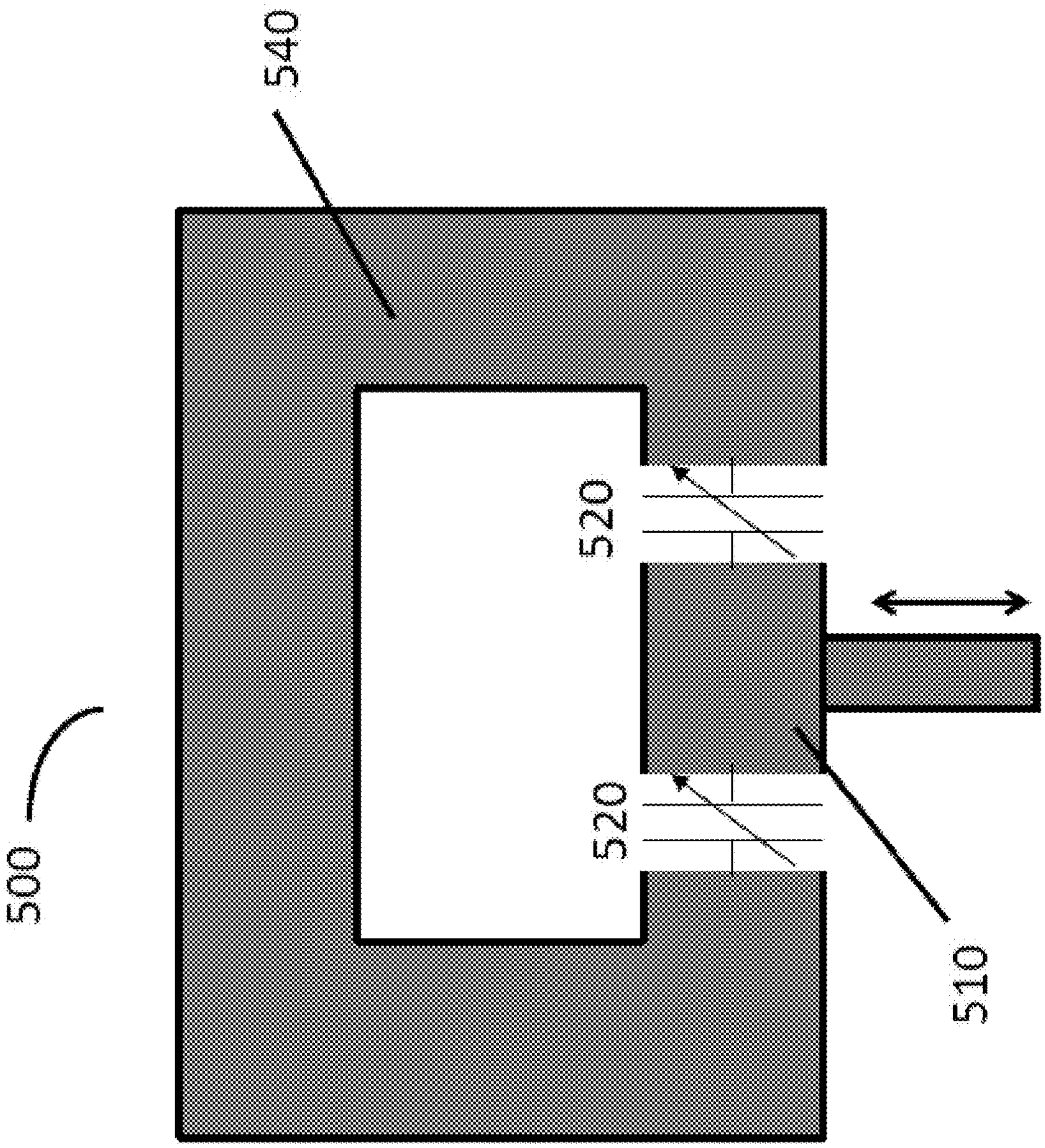
FIG. 5 shows a tunable capacitor element in between the capacitive leads of a split ring resonator, in an embodiment of the present work.

FIG. 5 shows another embodiment of a tunable electromagnetic filter element (SRR) 500. In this embodiment, an isolated conductor or semiconductor material 510 lies in the same plane in between the capacitive ends of electromagnetic resonator 540. This arrangement provides for 2 tunable capacitors in series, shown as elements 520. The isolated conductor or semiconductor material 510 can move in the direction indicated by the arrow in FIG. 5, changing the capacitance and resonant frequency of the electromagnetic resonator 540 by an actuator (not shown) connected to one end of the isolated conductor or semiconductor material 510.

Figure 6:
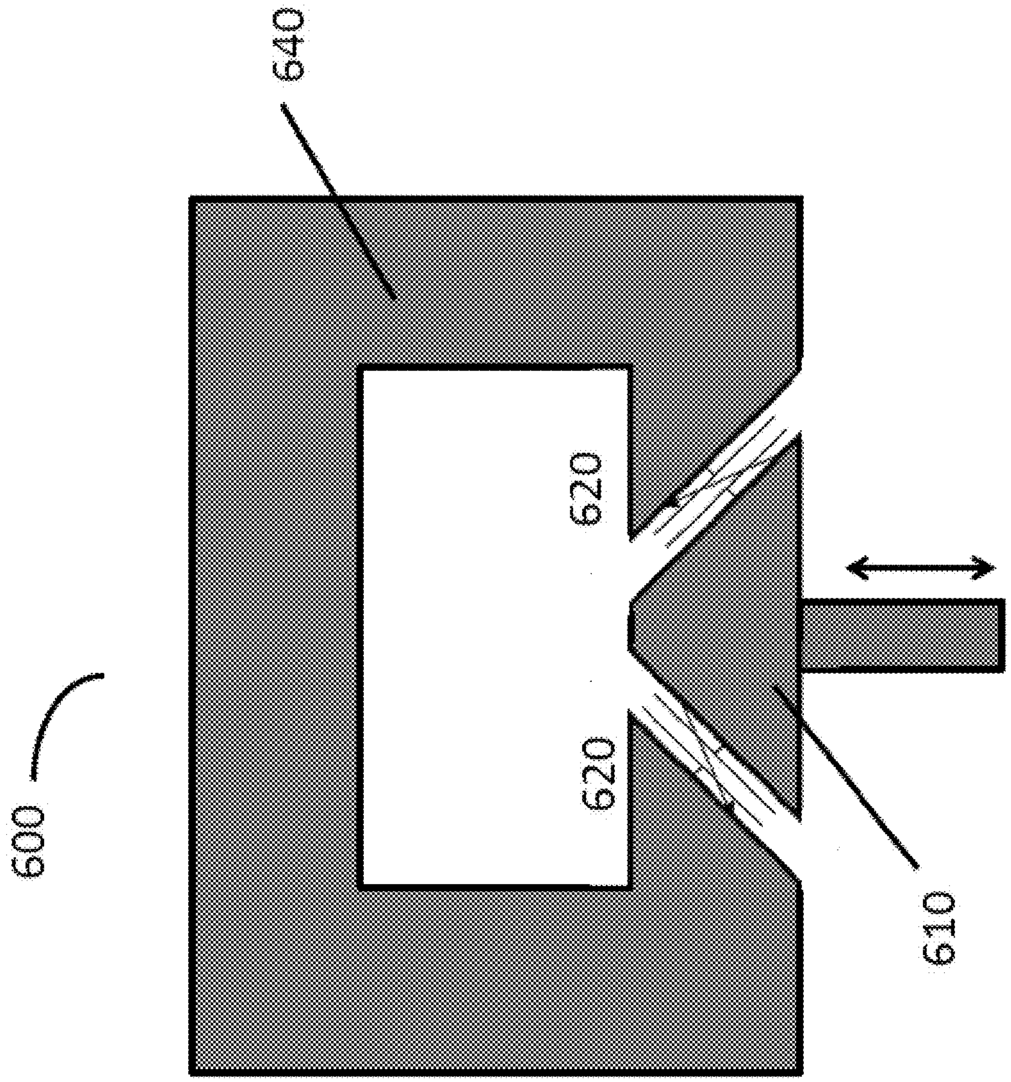
FIG. 6 shows a tunable capacitor element in between the capacitive leads of a split ring resonator, in another embodiment of the present work.

FIG. 6 shows another embodiment of a tunable electromagnetic filter element (SRR) 600. In this embodiment, an isolated conductor or semiconductor material 610 lies in the same plane in between the capacitive ends of electromagnetic resonator 640. This arrangement provides for 2 tunable capacitors in series, shown as elements 620. The isolated conductor or semiconductor material 610 can move in the direction indicated by the arrow in the figure, changing the capacitance and resonant frequency of the electromagnetic resonator 640 by an actuator (not shown) connected to one end of the isolated conductor or semiconductor material 610. The embodiment in FIG. 6 can provide a larger capacitive and frequency tuning range and has a broader resonance peak than the embodiment shown in FIG. 5.

Figure 7:
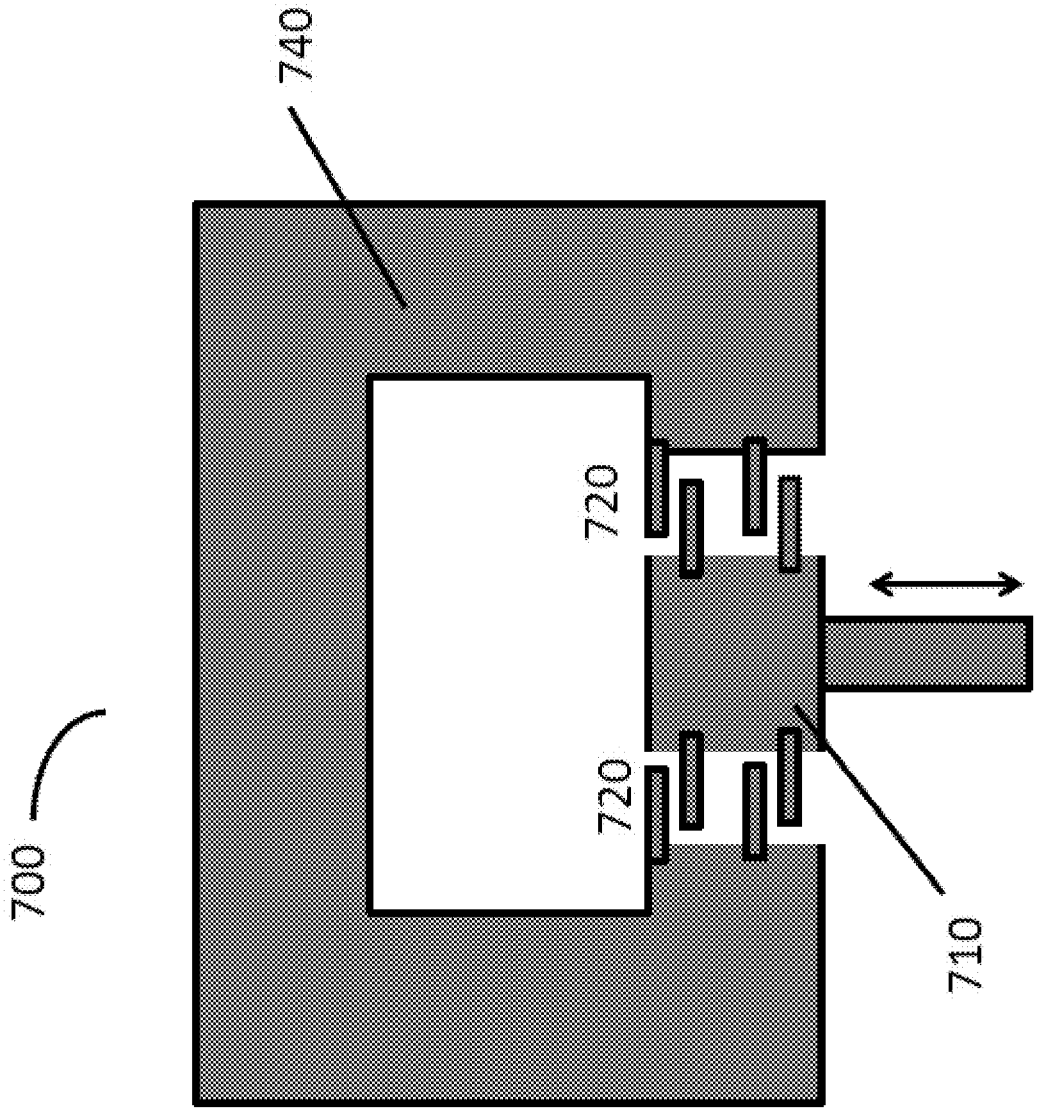
FIG. 7 shows a tunable capacitor element in between the capacitive leads of a split ring resonator, in another embodiment of the present work.

FIG. 7 shows another embodiment of a tunable electromagnetic filter element (SRR) 700. In this embodiment, an isolated conductor or semiconductor material 710 lies in the same plane in between the capacitive ends of electromagnetic resonator 740. This arrangement provides for 2 tunable capacitors in series, shown as elements 720. The isolated conductor or semiconductor material 710 can move in the direction indicated by the arrow in the figure, changing the capacitance and resonant frequency of the electromagnetic resonator 740 by an actuator (not shown) connected to one end of the isolated conductor or semiconductor material 710. The embodiment in FIG. 7 can provide a larger capacitive and frequency tuning range than the embodiment shown in FIG. 5, while maintaining a sharper resonance peak (higher Q) than the embodiment of FIG. 6.

Figure 8:
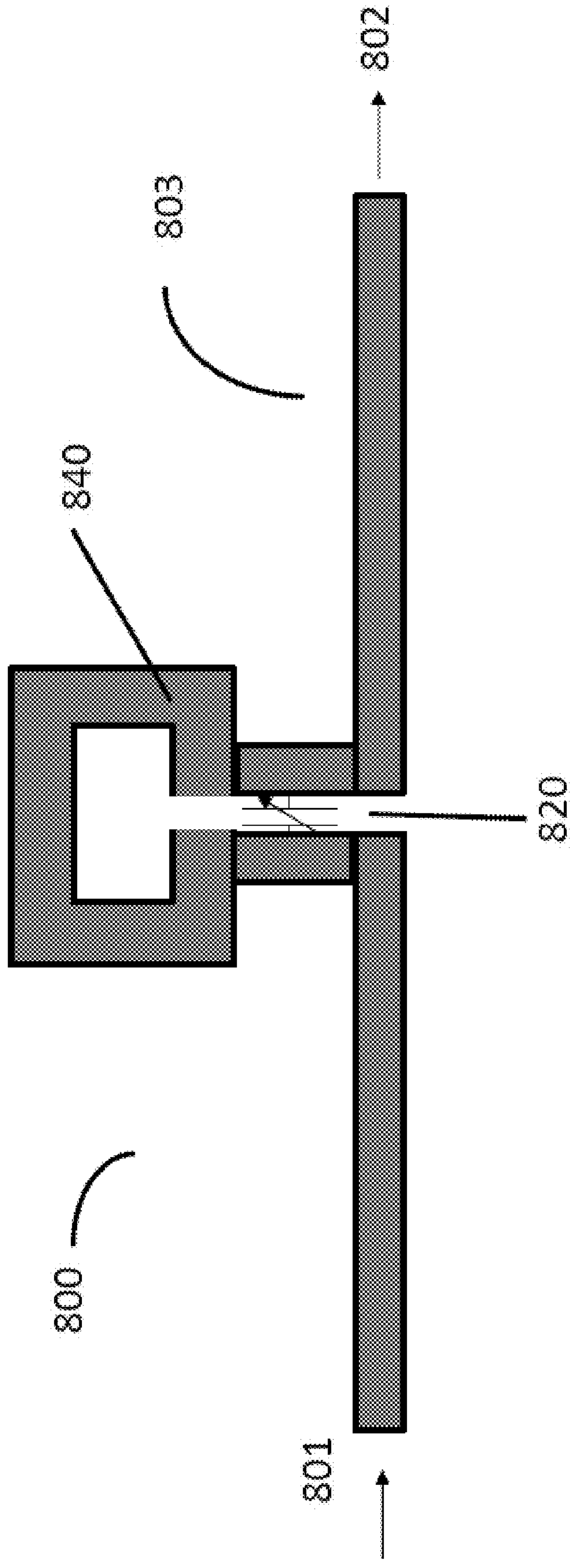
FIG. 8 depicts a tunable split ring resonator element in series with a transmission line, in an embodiment of the present work.

FIG. 8 shows a tunable electromagnetic split ring resonator (SRR) 840 connected in series with a transmission line 803 to form a tunable filter 800. The tunable filter 800 has an input port 801 and output port 802. Tunability of the electromagnetic split ring resonator including an isolated conductor or semiconductor and actuator mechanism is represented by the (symbolized) tunable capacitor 820. The tunable filter 800 in one embodiment provides a single tunable resonance peak, and when combined with passive filter elements including capacitors, resistors, inductors, and other resonators, comprises a tunable band pass filter.

Figure 9:
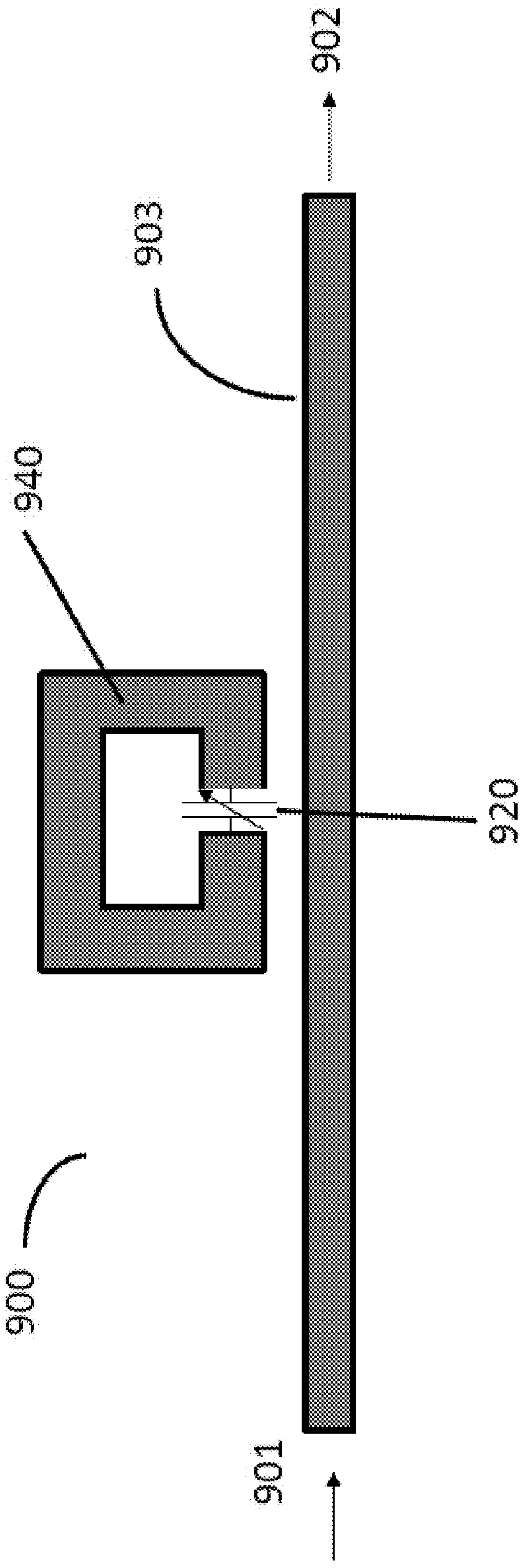
FIG. 9 shows a tunable split ring resonator element electromagnetically coupled to a transmission line, in an embodiment of the present work.

In another embodiment, FIG. 9 shows a tunable electromagnetic split ring resonator (SRR) 940 electromagnetically coupled to a transmission line 903 to form a tunable filter 900. The tunable filter 900 has an input port 901 and output port 902. Tunability of the electromagnetic split ring resonator including an isolated conductor or semiconductor and actuator mechanism is represented by the tunable capacitor symbol 920. The tunable filter 900 in one embodiment provides a single tunable resonance trough or notch in transmission, and comprises a tunable band stop or tunable notch filter. Tunable filter 900 can in general be combined with passive filter elements including capacitors, resistors, inductors, and other resonators, to provide more filtering performance.

Figure 10:
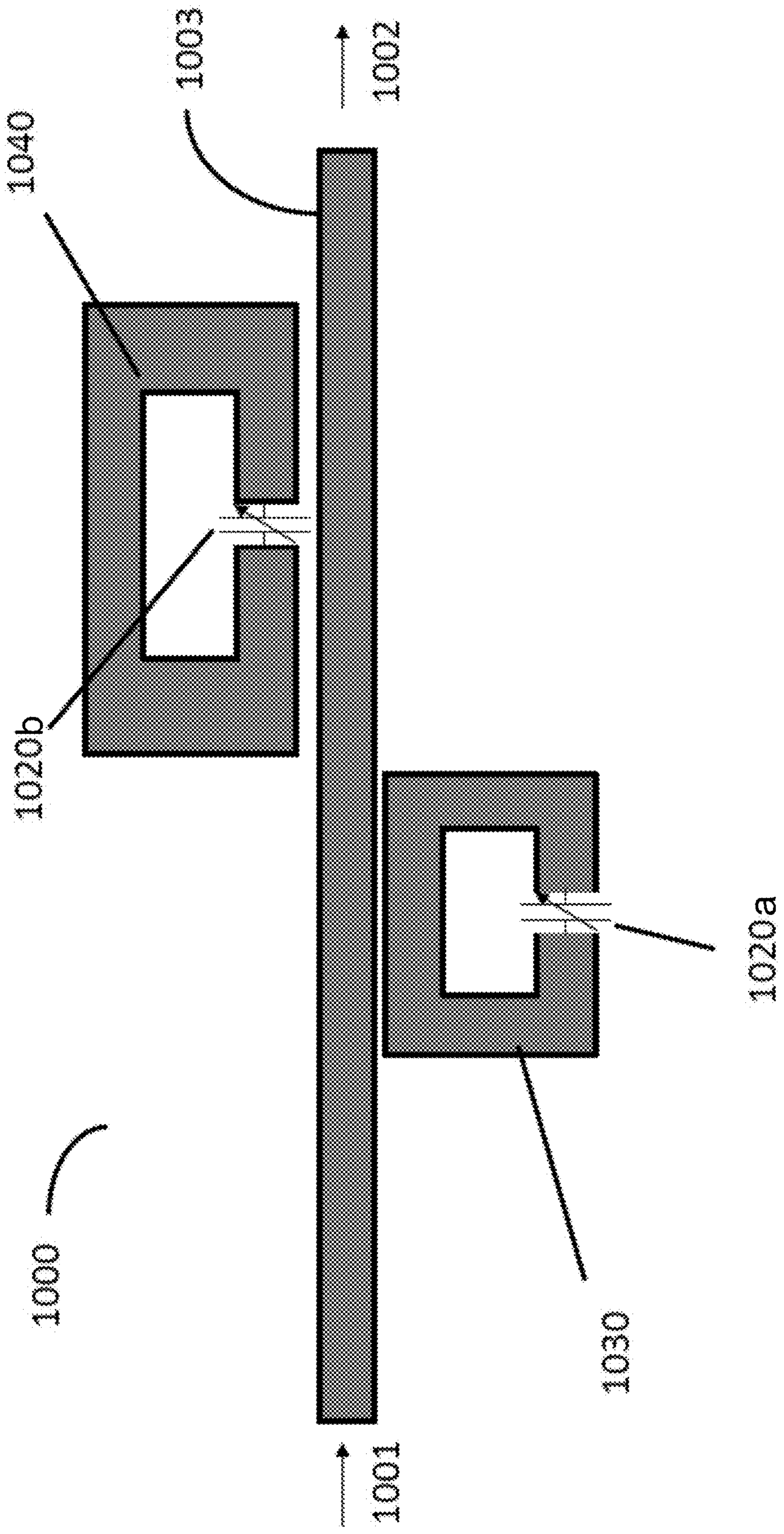
FIG. 10 shows multiple tunable split ring resonator elements electromagnetically coupled to a transmission line, in another embodiment of the present work.

In another embodiment, FIG. 10 shows a pair of tunable electromagnetic split ring resonators (SRR) 1030 and 1040, electromagnetically coupled to a transmission line 1003 to form a tunable filter 1000. The tunable filter 1000 has an input port 1001 and output port 1002. Tunability of the electromagnetic split ring resonators including an isolated conductor or semiconductor and actuator mechanism is represented by the tunable capacitors 1020*a-b* symbolized in each resonator. The tunable filter 1000 in one embodiment provides a dual tunable resonance trough or dual notches in transmission, and comprises a tunable dual band stop or dual tunable notch filter. The differing sizes of the electromagnetic resonators in FIG. 10 represent differing resonant frequencies within the filter. While FIG. 10 shows 2 tunable notch filters, more tunable resonators may be added in a similar matter to provide additional filtering within the context of this disclosure. Tunable filter 1000 can in general be combined with passive filter elements including capacitors, resistors, inductors, and other resonators, to provide more filtering performance. Various combinations and refinements of tunable resonators and passive elements may be created by those skilled in the art and are encompassed within the context of this disclosure.

Figure 11:
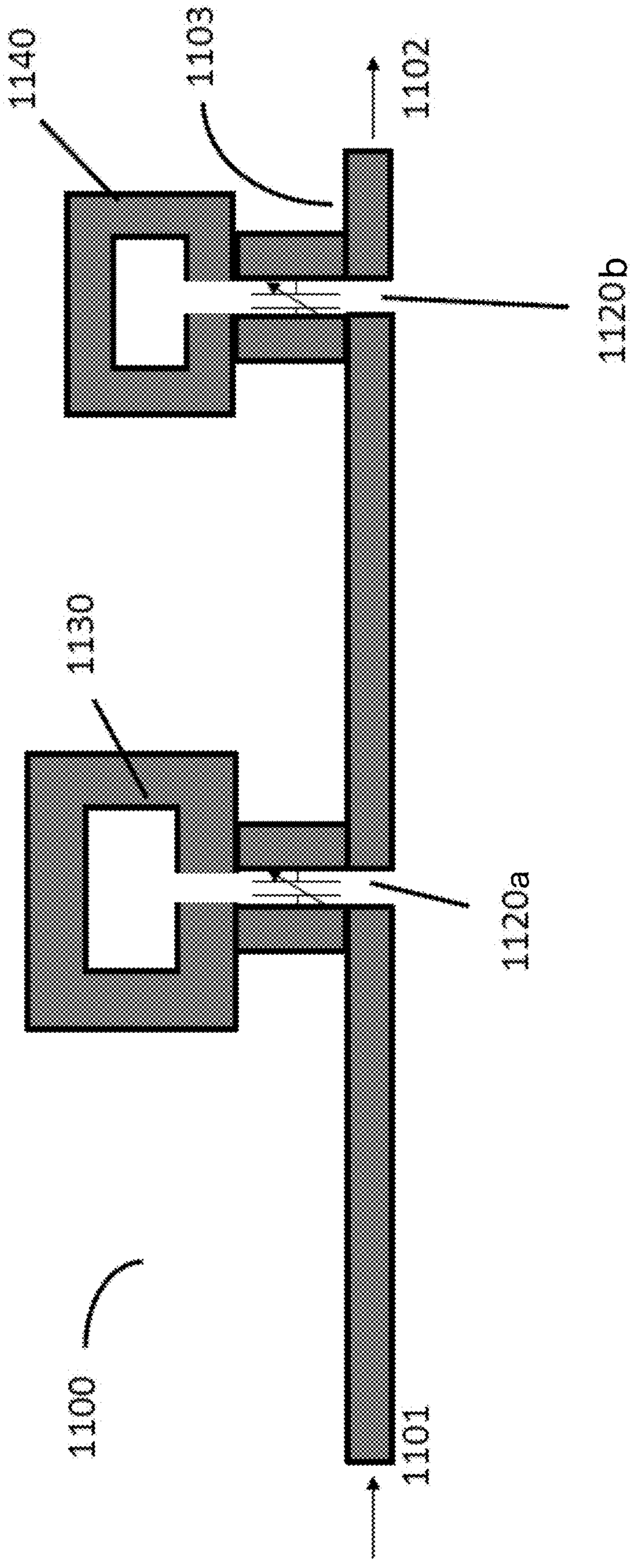
FIG. 11 depicts a series of tunable split ring resonator elements electromagnetically coupled to a transmission line, in another embodiment of the present work.

In yet another embodiment, FIG. 11 shows a pair of tunable electromagnetic split ring resonators (SRR) 1130 and 1140, connected in series to a transmission line 1103 to form a tunable filter 1100. The tunable filter 1100 has an input port 1101 and output port 1102. Tunability of the electromagnetic split ring resonators including an isolated conductor or semiconductor and actuator mechanism is represented by the tunable capacitors 1120*a-b* symbolized in each resonator. The tunable filter 1100 in one embodiment provides dual tunable resonance peaks in transmission, and comprises a tunable dual band pass filter, with independent tuning of each band filter. The differing sizes of the electromagnetic resonators in FIG. 11 represent differing resonant frequencies within the filter. A notable and important feature of the tunable resonators in this disclosure is the ability of the tunable resonators to continue to transmit signals through the resonators even when resonance is suppressed. In a high coupling state with an isolated conductor or semiconductor material in close proximity to an electromagnetic resonator, signal transmission occurs through the capacitive bridge to the other side of the resonator and continues, as verified through simulation results. While FIG. 11 shows 2 tunable band pass filters, more tunable resonators may be added in a similar matter to provide additional filtering within the context of this disclosure. Tunable filter 1100 can in general be combined with passive filter elements including capacitors, resistors, inductors, and other resonators, to provide more filtering performance. Various combinations, shapes, sizes, frequency ranges and refinements of tunable resonators and passive elements may be created by those skilled in the art and are encompassed within the context of this disclosure.

Figure 12A:
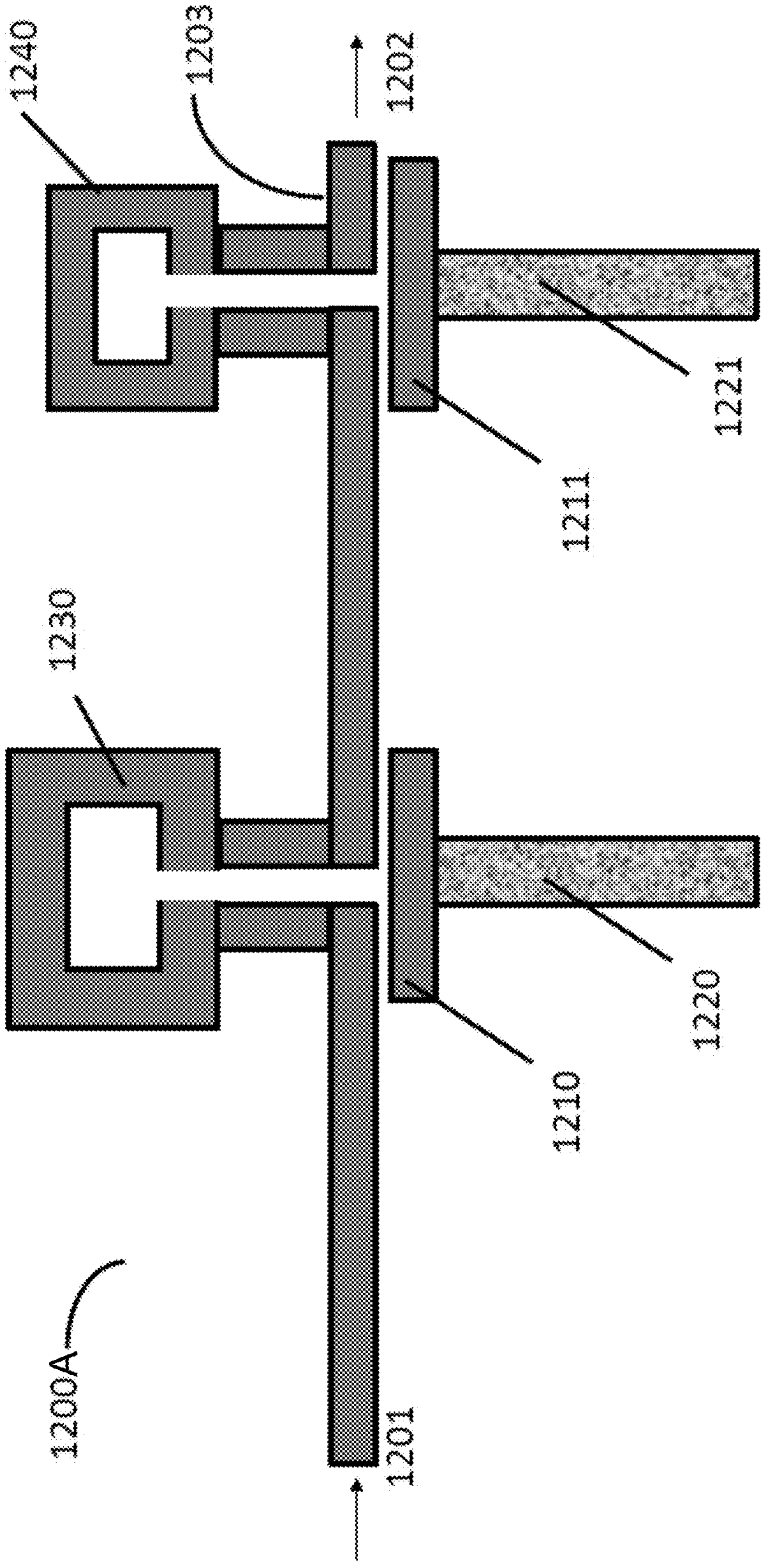
FIGS. 12A-D depict tuning of multiple resonator elements in an embodiment of the present work.

FIGS. 12A-D show tuning operation(s) of dual band pass filter resonators in one embodiment of the present work. FIG. 12A shows a pair of tunable electromagnetic split ring resonators (SRR) 1230 and 1240, connected in series to a transmission line 1203 to form a tunable filter 1200. The tunable filter 1200 has an input port 1201 and output port 1202 with an AC signal applied across the input port and ground. Tunability of the electromagnetic split ring resonators is indicated with isolated conductor or semiconductor materials 1210 and 1211 and the actuator mechanism is represented by structures 1220 and 1221. The tunable filter 1200 in one embodiment provides dual tunable resonance peaks in transmission, and comprises a tunable dual band pass filter, with independent tuning of each band filter. The differing sizes of the electromagnetic resonators in FIGS. 12A-D represent differing resonant frequencies within the filter. In FIG. 12A, the positions of the isolated conductor or semiconductor materials 1210 and 1211 represent that they are strongly coupled to the capacitive ends of tunable resonators 1230 and 1240, respectively. In this configuration, the resonant frequency is lowered and resonance is suppressed in each resonator, allowing signals to pass undisturbed in the frequency range of interest.

Figure 12B:
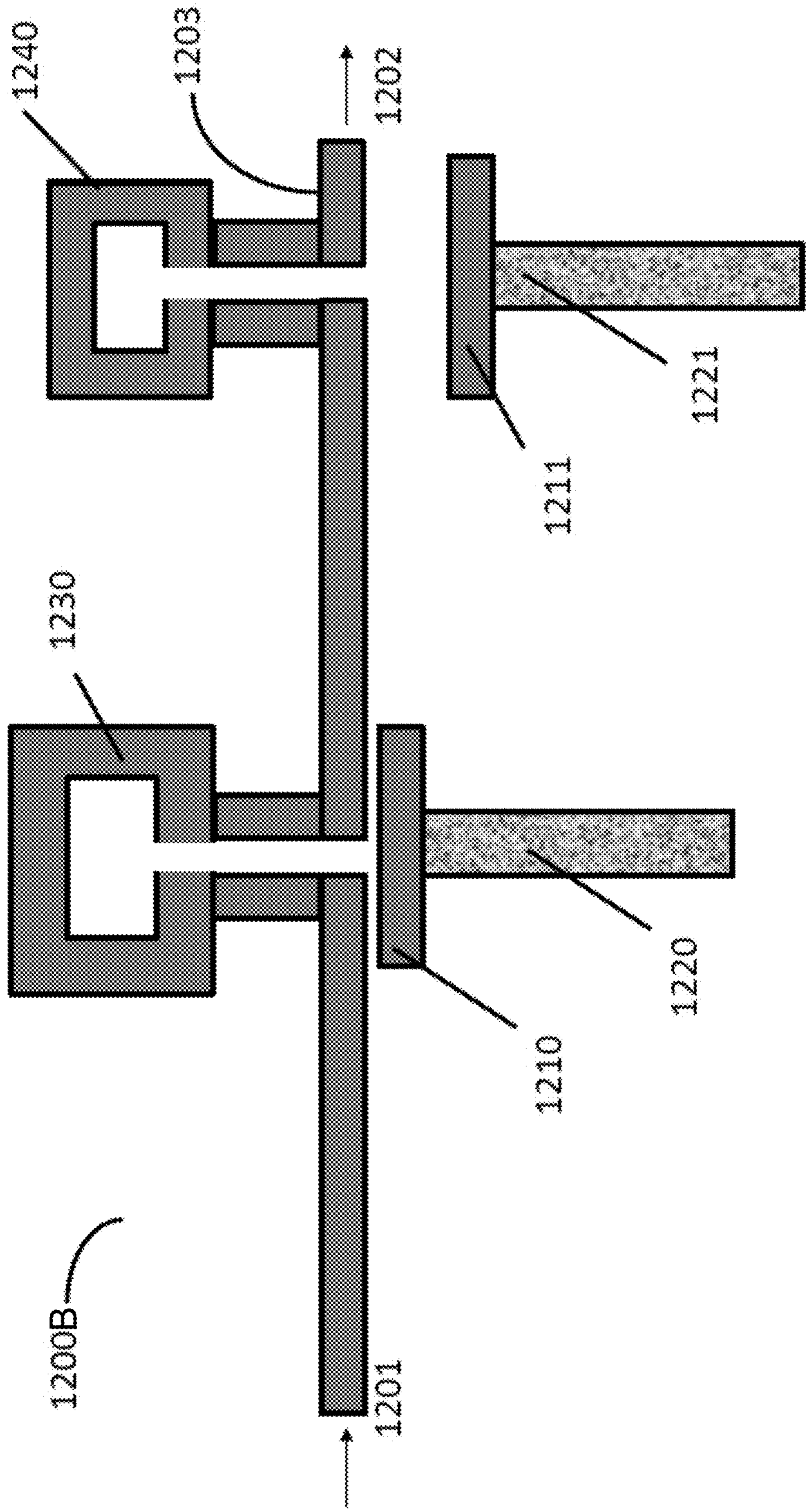

FIG. 12B represents a configuration where actuator 1221 is actuated, pulling isolated conductor or semiconductor material 1211 away from the capacitive ends of resonator 1240, increasing the resonant frequency and enabling resonance within resonator 1240 upon application of the appropriate signal frequency along the transmission line 1203. In FIG. 12B, a band pass filter is established using the resonant frequency of resonator 1240 and isolated conductor or semiconductor 1211. In FIG. 12B, resonance is suppressed in resonator 1230 due to the close proximity of conductor or semiconductor 1210, which bridges the capacitive ends of resonator 1230.

Figure 12C:
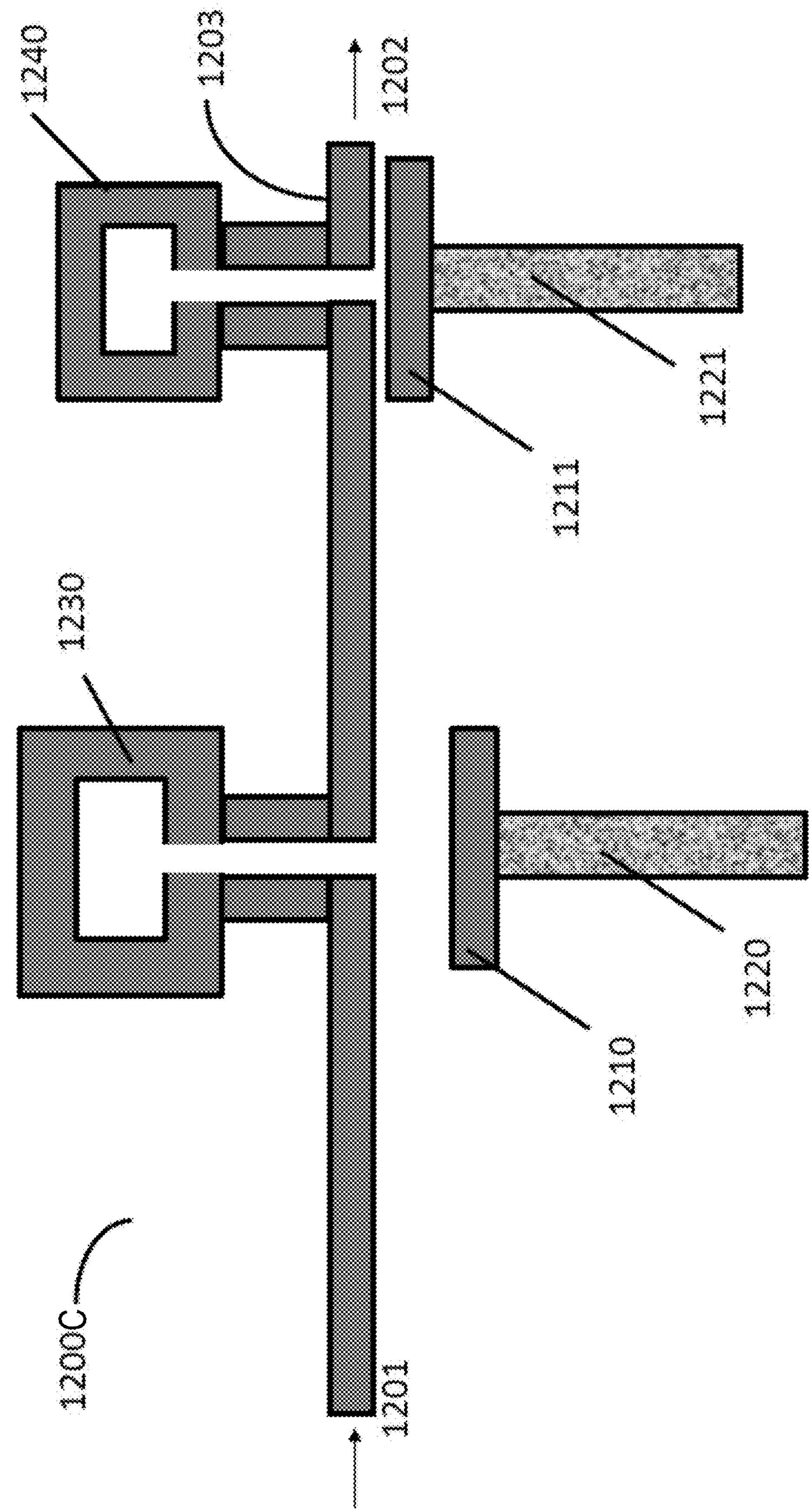

FIG. 12C represents a configuration where actuator 1220 is actuated, pulling isolated conductor or semiconductor material 1210 away from the capacitive ends of resonator 1230, increasing the resonant frequency and enabling resonance within resonator 1230 upon application of the appropriate signal frequency along the transmission line 1203. Resonator 1240 is suppressed due to the proximity of conductor or semiconductor 1211. In FIG. 12C, a band pass filter is established using the resonant frequency of resonator 1230 and isolated conductor or semiconductor 1210.

Figure 12D:
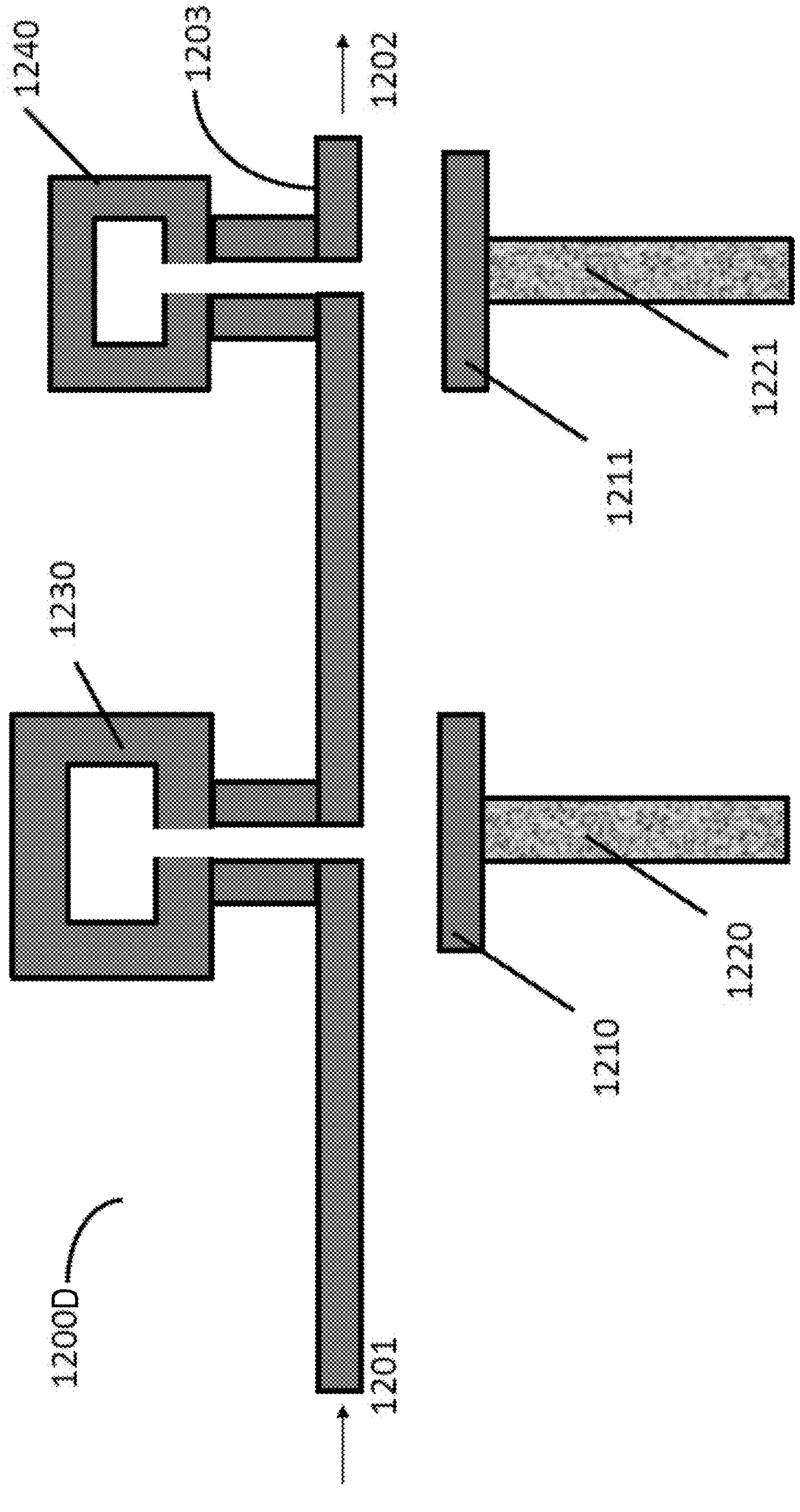

FIG. 12D represents a configuration where actuator 1220 and 1221 are both actuated, pulling isolated conductor or semiconductor materials 1210 and 1211 away from the capacitive ends of resonators 1230 and 1240, respectively, increasing the resonant frequency and enabling resonance within resonators 1230 and 1240 upon application of the appropriate signal frequencies along the transmission line 1203. In FIG. 12D, a dual band pass filter is established using the resonant frequency of resonator 1230 and isolated conductor or semiconductor 1210, and the resonant frequency of resonator 1240 and isolated conductor or semiconductor 1211.

Figure 13:
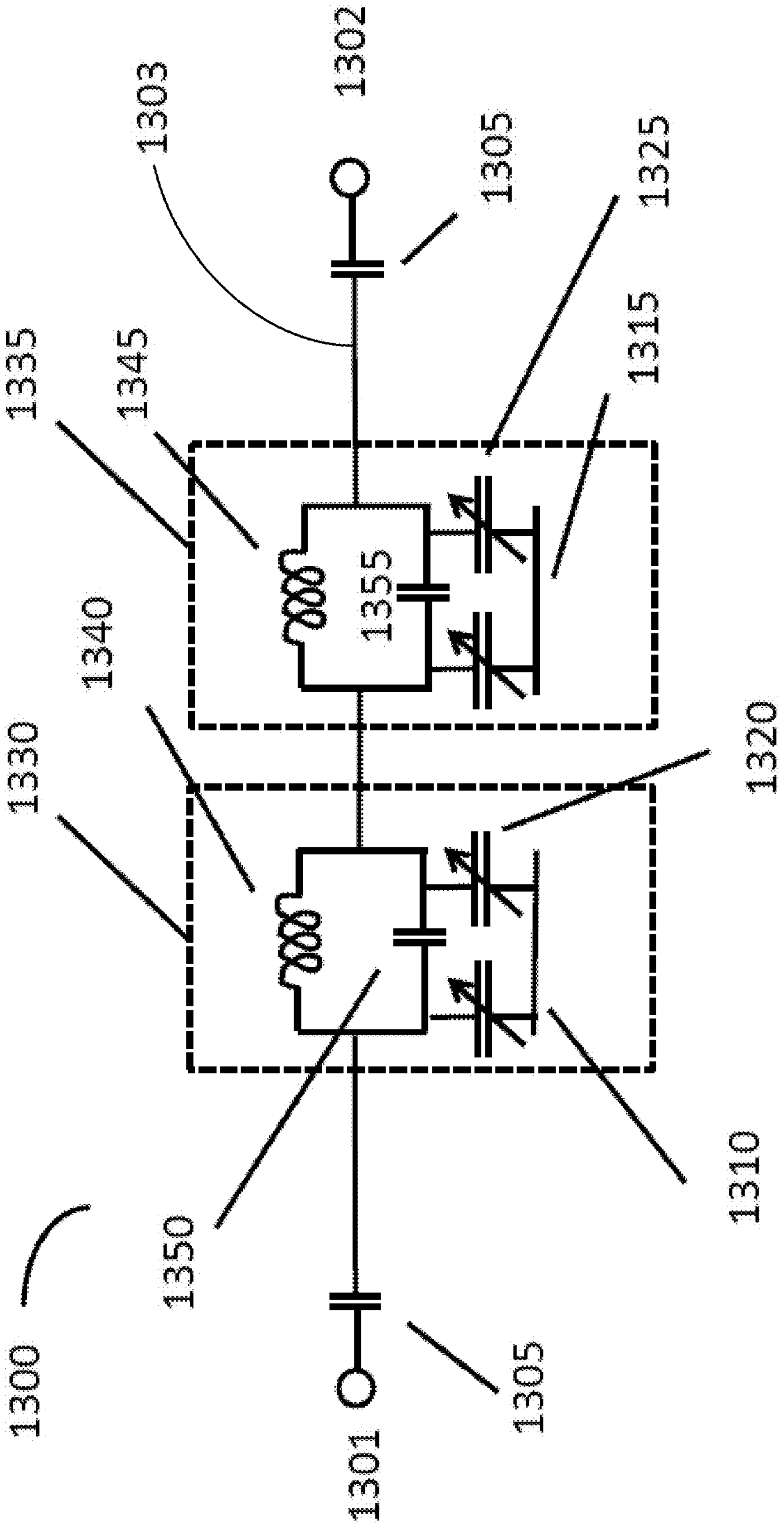
FIG. 13 shows a schematic of tunable band pass filter elements in an embodiment of the present work.

FIG. 13 shows a schematic 1300 of two tunable filter elements 1330 and 1335 connected to a transmission line 1303 to form a dual bandpass tunable filter, as shown in FIGS. 12A-D and described above. The transmission line 1303 has an input port 1301, output port 1302, and in general contains other passive filter elements, represented here by DC blocking capacitors 1305. The electromagnetic resonators are represented by capacitors 1350 and 1355 and inductors 1340 and 1345. The isolated conductors or semiconductor materials are represented as nodes 1310 and 1315, respectively. The variable capacitors 1320 and 1325 represent tuning of the actuators which move the isolated conductors or semiconductors with respect to the capacitive ends of the resonators in one embodiment.

Figure 14:
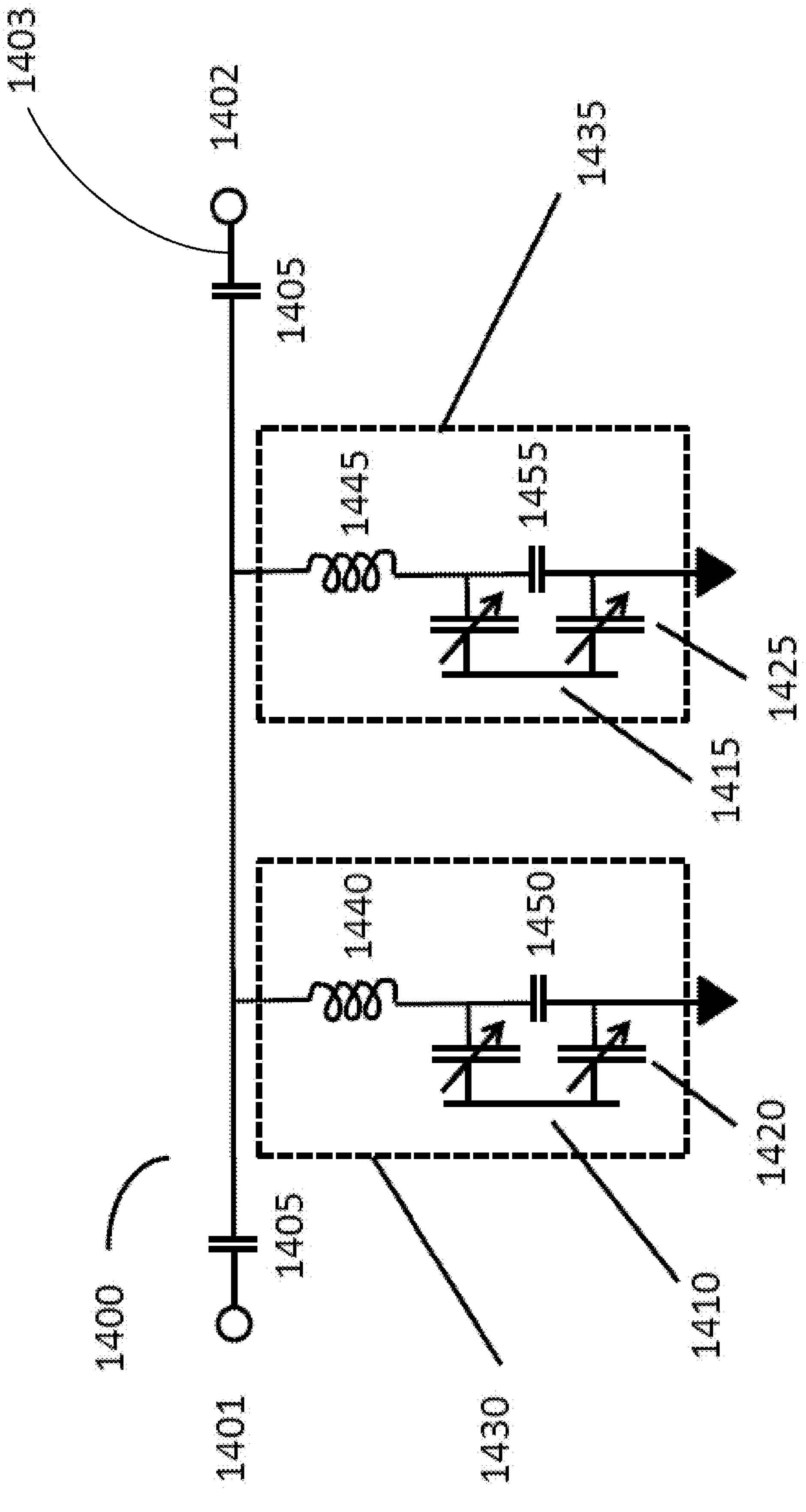
FIG. 14 shows a schematic of tunable band stop filter elements in an embodiment of the present work.

In another embodiment, FIG. 14 shows a schematic 1400 of two tunable filter elements 1430 and 1435 connected to a transmission line 1403 to form a dual band stop or dual notch tunable filter. The transmission line 1403 has an input port 1401, output port 1402, and in general contains other passive filter elements, represented here by DC blocking capacitors 1405. Electromagnetic resonators are represented by capacitors 1450 and 1455 and inductors 1440 and 1445. The isolated conductors or semiconductor materials are represented as nodes 1410 and 1415, respectively. The variable capacitors 1420 and 1425 represent tuning of the actuators which move the isolated conductors or semiconductors with respect to the capacitive ends of the resonators in one embodiment. FIG. 14 shows one example of an embodiment employing multiple band stop resonators. Additional tunable band stop, tunable band pass, passive components and other resonators may be added to the tunable filter within the scope of the present work.

Figure 15:
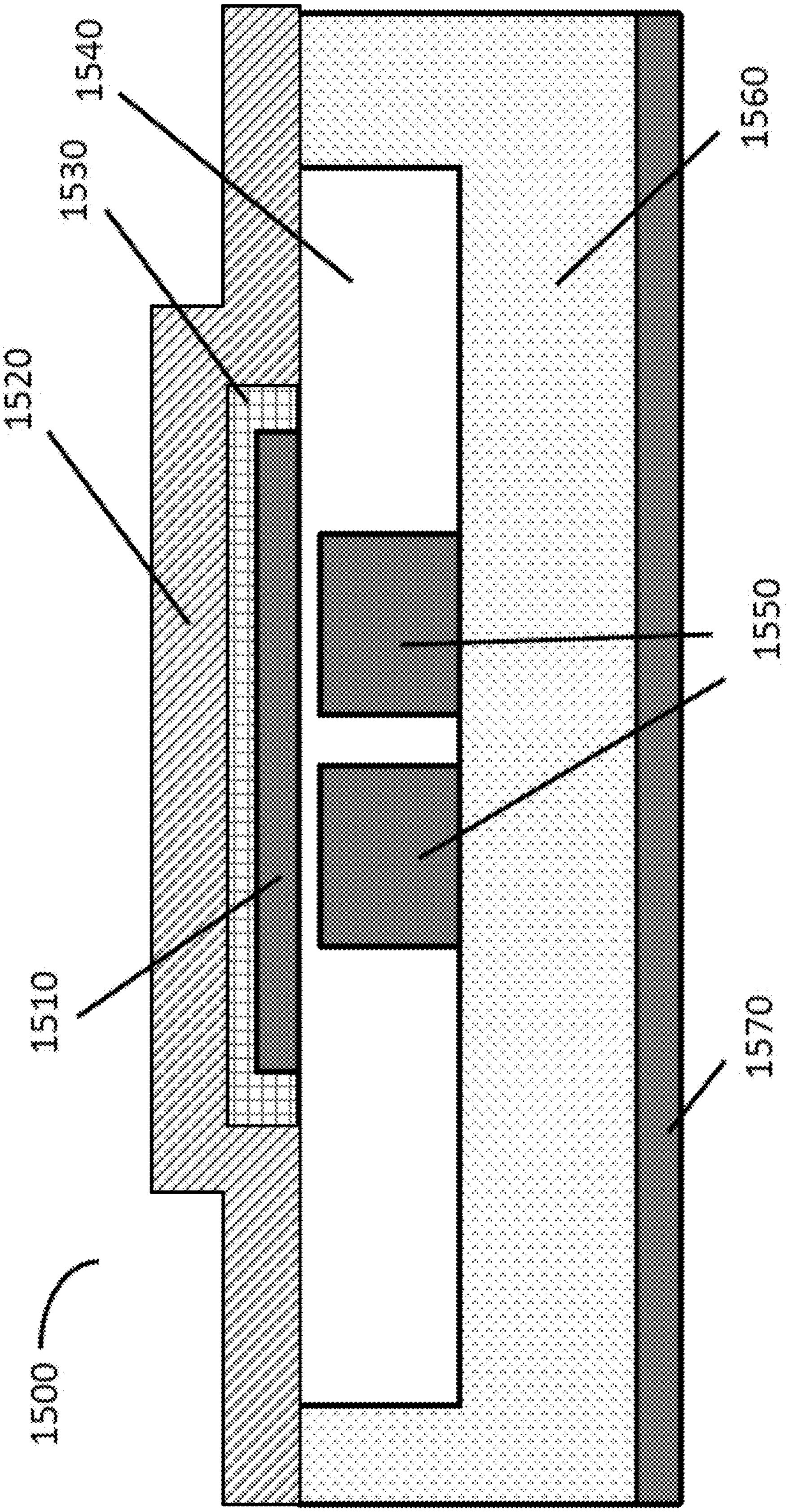
FIG. 15 shows a cross section of a tunable filter element in one embodiment of the present work.
Figure 16:
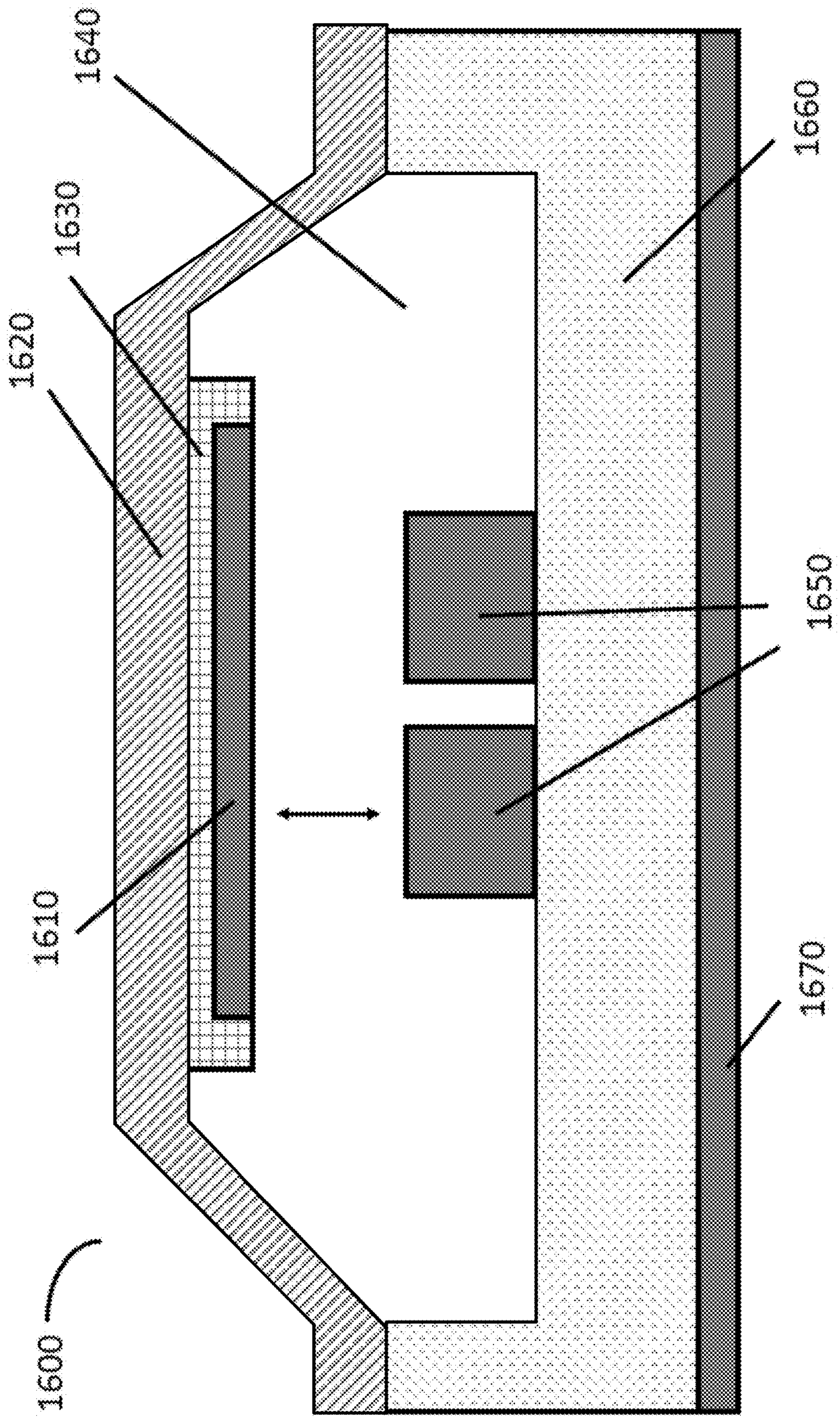
FIG. 16 shows a cross section of an activated tunable filter element in one embodiment of the present work.

FIGS. 15 and 16 show cross sections of a resonator tuning implementation and method in one embodiment of the present work. FIG. 15 is repeated from FIG. 1 for purposes of illustration with FIG. 16. The tunable filter element 1500 comprises an isolated conductor or semiconductor material 1510, mechanical actuator 1520, electrical isolation layer 1530, cavity 1540, low-loss substrate 1560, electrical ground plane 1570 and shows a cross section of the capacitive ends of an electromagnetic resonator 1550. In one embodiment, the actuator 1520 is a piezoelectric material which moves in response to an applied electric voltage, not shown. In another embodiment the actuator 1520 is a microelectromechanical (MEMS) support structure actuated electrostatically. Additional implementations of the actuator 1520 include magnetic actuation and thermal activation.

FIG. 15 shows isolated conductor or semiconductor 1510 in close proximity to the capacitive ends 1550 of an electromagnetic resonator. The capacitive ends 1550 of an electromagnetic resonator may be connected or electromagnetically coupled to a transmission line, not shown. In this configuration, there is strong capacitive coupling of material 1510 to capacitive ends 1550, which lowers the resonant frequency of the resonator and suppresses resonance within the resonator. The isolated conductor or semiconductor 1510 may have a high resistance connection to a voltage source or other circuit node, but is considered electrically isolated on the time scales associated with the applied AC signals within a transmission line such as those described herein and shown in the accompanying drawings.

FIG. 16 shows the tunable resonator 1600 from FIG. 15 upon activation of a mechanical actuator that moves isolated conductor or semiconductor 1610 away from the capacitive ends 1650 of an electromagnetic resonator. The tunable filter element 1600 comprises an isolated conductor or semiconductor material 1610, mechanical actuator 1620, electrical isolation layer 1630, cavity 1640, low-loss substrate 1660, electrical ground plane 1670, and shows a cross section of the capacitive ends of an electromagnetic resonator 1650. The capacitive ends 1650 of an electromagnetic resonator may be connected or electromagnetically coupled to a transmission line, not shown.

Moving material 1610 away from the capacitive ends 1650 of the resonator increases the resonant frequency and allows greater resonant energy to be stored in the resonator upon application of an appropriate AC signal to the transmission line. Moving material 1610 away from the resonator ends 1650 allows activation of the resonator and enables the resonator to contribute to filtering of signals along the transmission line. The resonant frequency of tunable resonator 1600 is adjusted by adjusting the height of material 1610 above resonator ends 1650.

Figure 17:
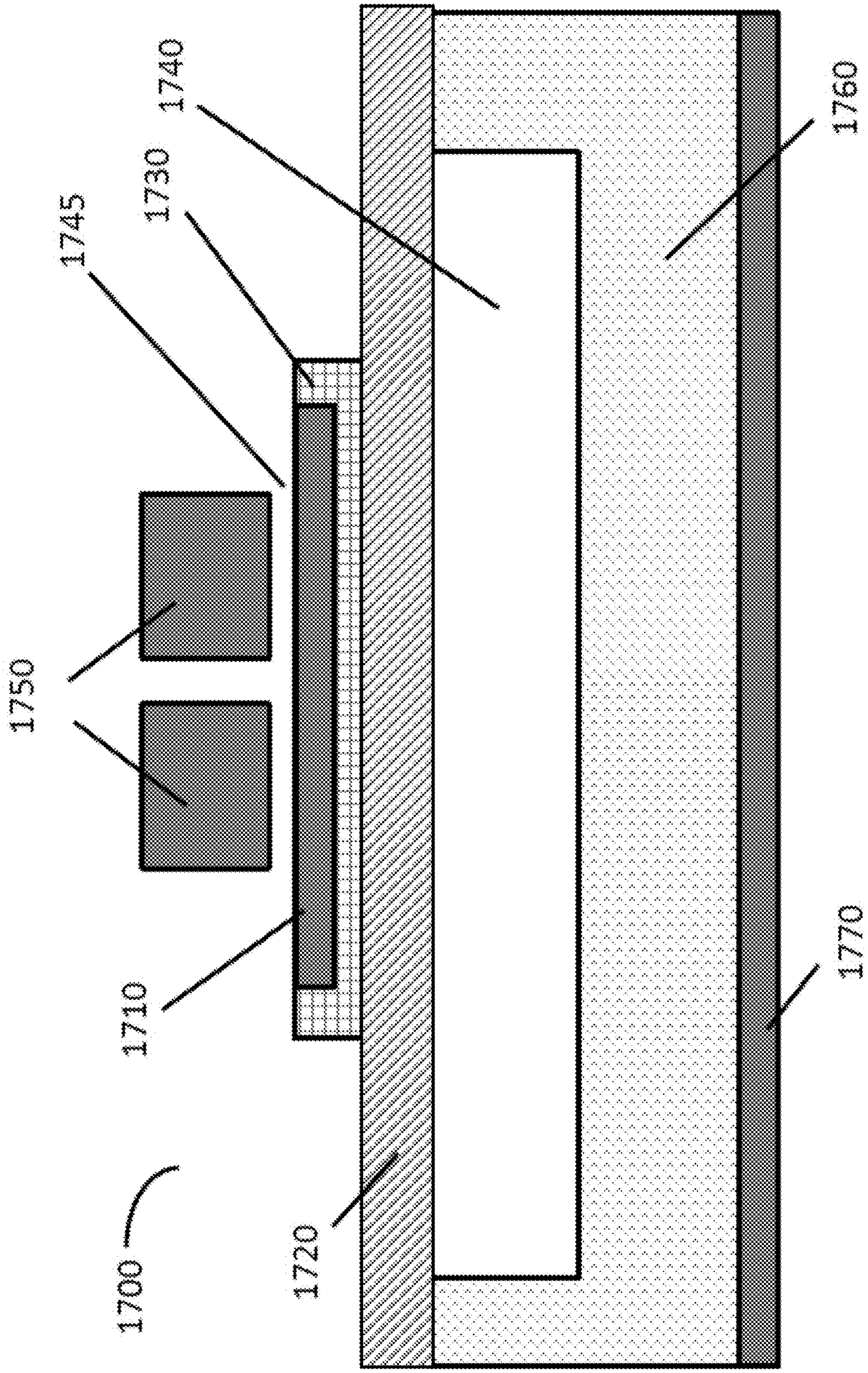
FIG. 17 shows a cross section of a tunable filter element in another embodiment of the present work.

FIG. 17 shows another embodiment of a tunable filter element 1700 in the present work. The tunable filter element 1700 comprises an isolated conductor or semiconductor material 1710, mechanical actuator 1720, electrical isolation layer 1730, cavity 1740, air gap 1745, low-loss substrate 1760 electrical ground plane 1770, and shows a cross section of the capacitive ends of an electromagnetic resonator 1750. The electromagnetic resonator 1750 has an air gap 1745 below and is supported by a support structure out of the cross-section plane and is not shown. The capacitive ends 1750 of an electromagnetic resonator may be connected or electromagnetically coupled to a transmission line, not shown. In one embodiment, the actuator 1720 is a piezoelectric material which moves in response to an applied electric voltage, not shown. In another embodiment, the actuator 1720 is a microelectromechanical (MEMS) support structure that may be actuated electrostatically. Additional implementations of the actuator 1720 include magnetic actuation and thermal activation.

Figure 18:
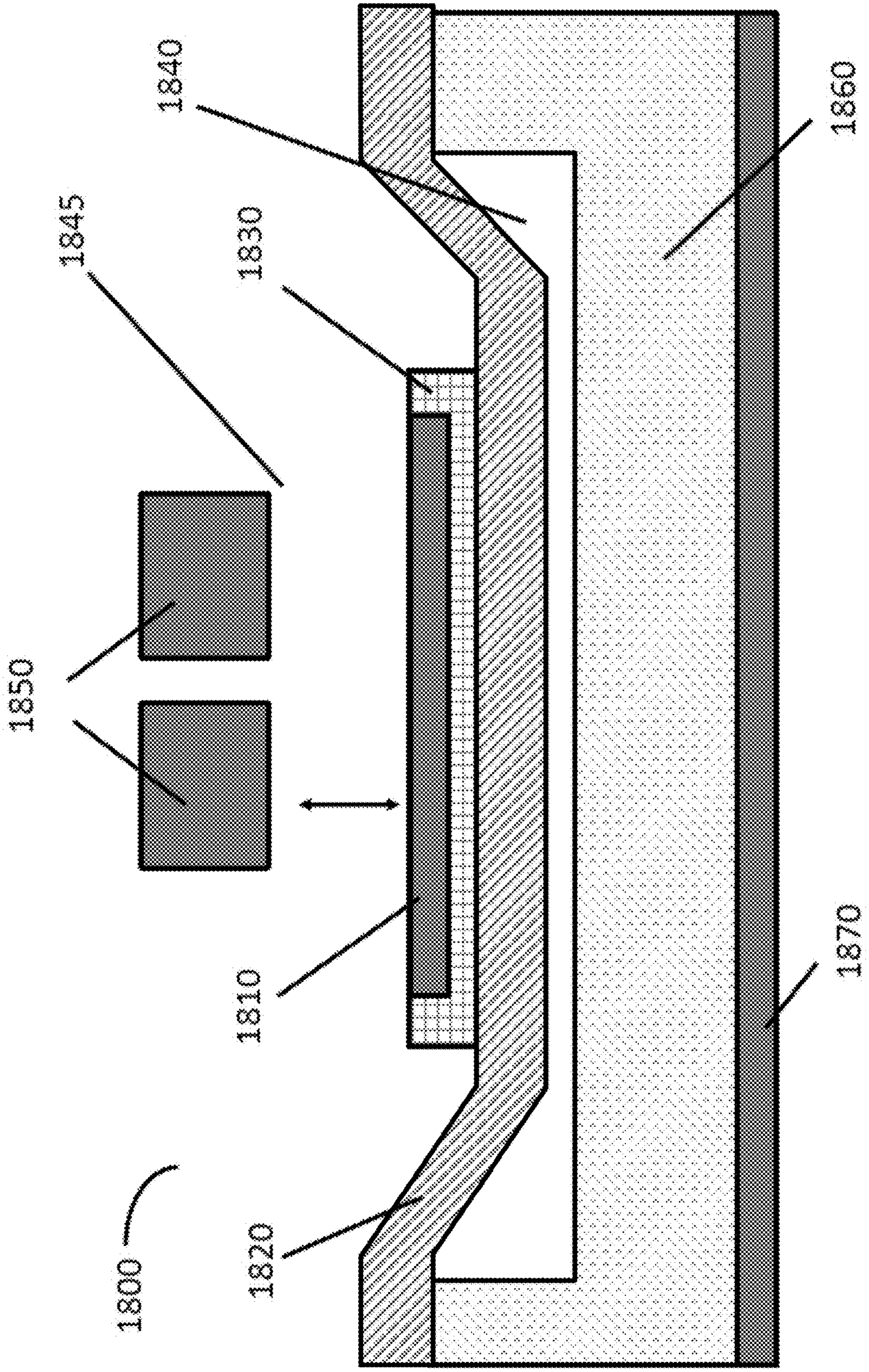
FIG. 18 shows a cross section of an activated tunable filter element in another embodiment of the present work.

FIG. 18 shows the tunable resonator 1800 from FIG. 17 upon activation of a mechanical actuator that moves isolated conductor or semiconductor 1810 away from the capacitive ends 1850 of an electromagnetic resonator. The tunable filter element 1800 comprises an isolated conductor or semiconductor material 1810, mechanical actuator 1820, electrical isolation layer 1830, cavity 1840, low-loss substrate 1860, electrical ground plane 1870, and shows a cross section of the capacitive ends of an electromagnetic resonator 1850. The electromagnetic resonator 1850 has an air gap 1845 below and is supported by a support structure out of the cross-section plane and is not shown. The capacitive ends 1850 of an electromagnetic resonator may be connected or electromagnetically coupled to a transmission line, not shown.

Moving material 1810 away from the capacitive ends 1850 of the resonator increases the resonant frequency and allows greater resonant energy to be stored in the resonator upon application of an appropriate AC signal to the transmission line. Moving material 1810 away from the resonator ends 1850 allows activation of the resonator and enables the resonator to contribute to filtering of signals along the transmission line. The resonant frequency of tunable resonator 1800 is adjusted by adjusting the height of material 1810 below resonator ends 1850.

Figures 19A, 19B:
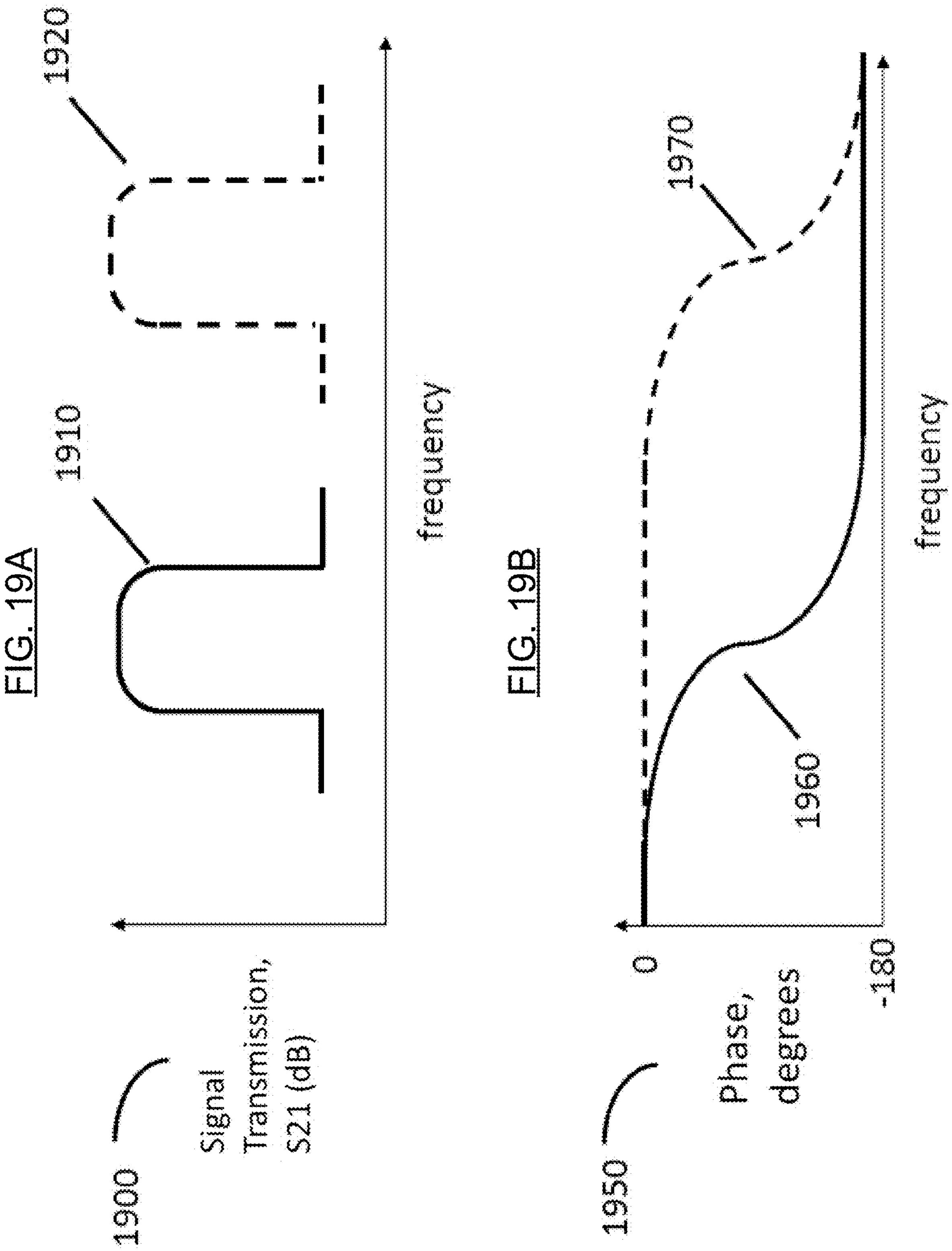
FIGS. 19A-B show the transmission amplitude and phase behavior for 2 states of a tunable passband filter in one embodiment of the present work.

FIG. 19A is a graph 1900 depicting the signal transmission amplitude S21 from port 1 to port 2 (in dB) and FIG. 19B is a graph 1950 depicting an output signal phase for two states of a tunable dual bandpass (e.g., 2-SRR) filter similar to that depicted in FIGS. 12A-D. With a higher frequency resonator activated such as that indicated by the smaller resonator 1240 in FIG. 12B, resonance peak 1920 in FIG. 19A represents the band pass filter performance, and resonance peak 1910 does not appear. In this configuration, the phase behavior vs. frequency is represented by curve 1970 in FIG. 19B. Note the phase behavior can be selected for a given frequency by tuning the actuator resonance.

Referring again to FIGS. 19A-B and FIGS. 12A-D, with a lower frequency resonator activated such as that indicated by the larger resonator 1230 in FIG. 12C, resonance peak 1910 in FIG. 19A represents the band pass filter performance, and resonance peak 1920 does not appear. In this configuration, the phase behavior vs. frequency is represented by curve 1960 in FIG. 19B.

In the case of FIG. 12D, wherein both resonators 1230 and 1240 are activated, the dual band pass filter output is represented by both resonance peaks 1910 and 1920 shown in FIG. 19A. The phase behavior corresponding to FIG. 12D with both resonators activated is not shown.

In the case of FIG. 12A, wherein both resonators 1230 and 1240 are suppressed, there is no significant filtering effect or phase change in the frequency range of interest.

Figure 20A:
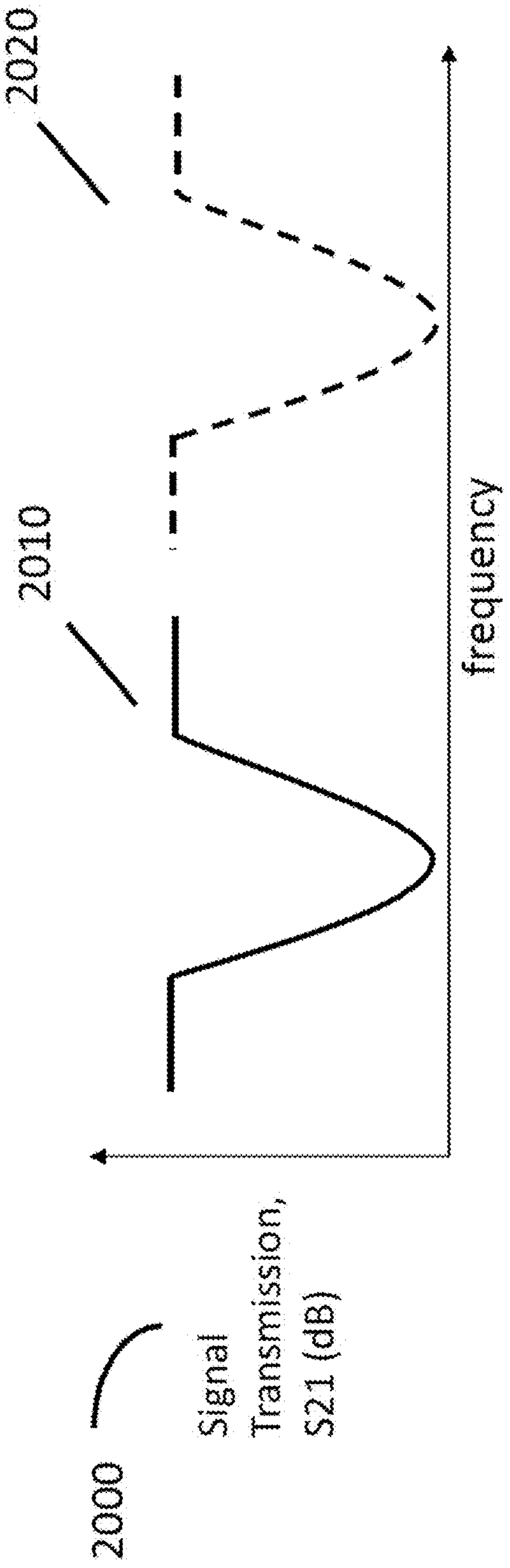
FIGS. 20A-B show the transmission amplitude and phase behavior for 2 states of a tunable notch filter in another embodiment of the present work.
Figure 20B:
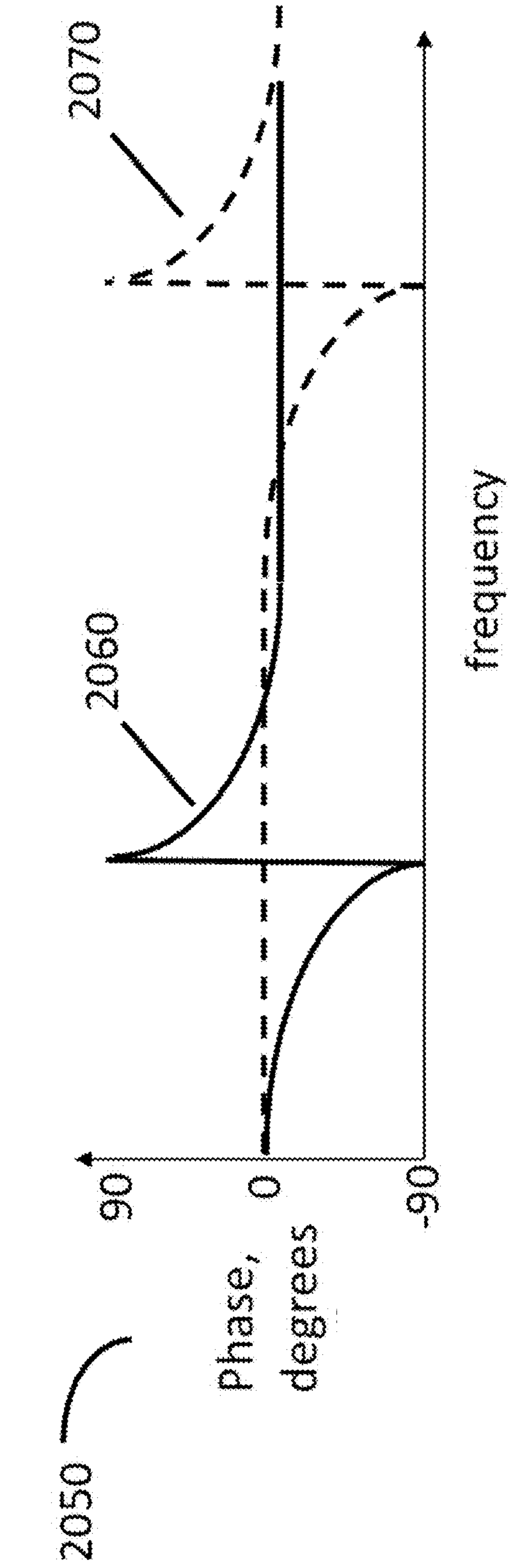

FIG. 20A is a graph 2000 depicting the signal transmission amplitude S21 from port 1 to port 2 (in dB) and FIG. 20B is a graph 2050 depicting the output signal phase for two states of a tunable dual band stop or dual notch (e.g., 2-SRR) filter similar to that depicted in FIG. 10. With a higher frequency resonator activated such as that indicated by the smaller resonator 1030 in FIG. 10, resonance trough 2020 in FIG. 20A represents the band stop or notch filter performance, and resonance trough 2010 does not appear. In this configuration, the phase behavior vs. frequency is represented by curve 2070 in FIG. 20B.

Referring again to FIGS. 20A-B and FIG. 10, with a lower frequency resonator activated such as that indicated by the larger resonator 1040 in FIG. 10, the resonance peak 2010 in FIG. 20A represents the band stop or notch filter performance, and resonance trough 2020 does not appear. In this configuration, the phase behavior vs. frequency is represented by curve 2060 in FIG. 20B.

In the case of FIG. 10, wherein both resonators 1030 and 1040 are activated, the dual band stop or notch filter output is represented by both resonance troughs 2010 and 2020 shown in FIG. 20A. The phase behavior corresponding to FIG. 10 with both resonators activated is not shown.

In the case of FIG. 10, wherein both resonators 1030 and 1040 are suppressed, there is no significant filtering effect or phase change in the frequency range of interest.

Figure 21A:
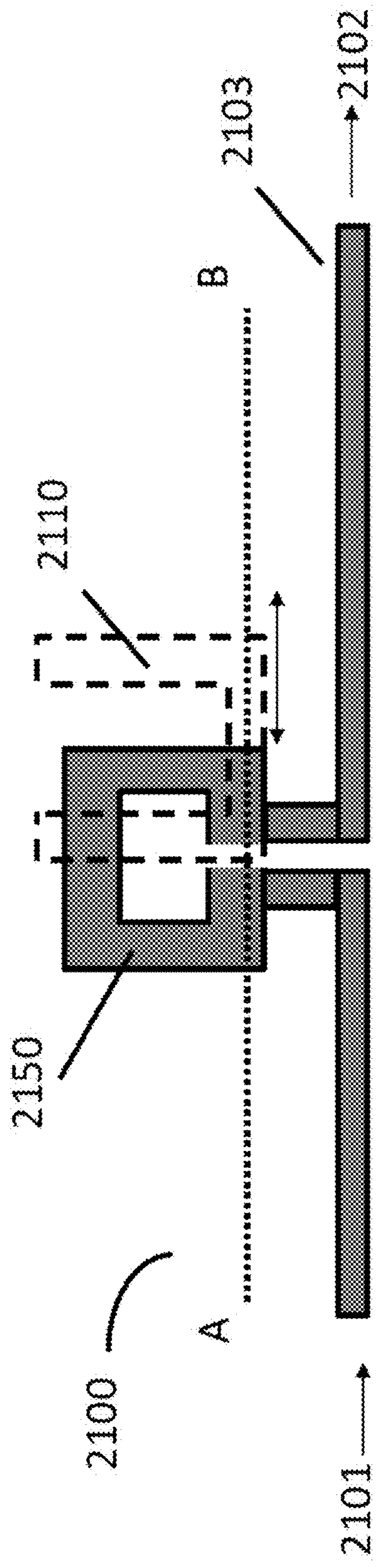
FIGS. 21A-B show an implementation of inductive tuning of a resonator element in one embodiment of the present work.
Figure 21B:
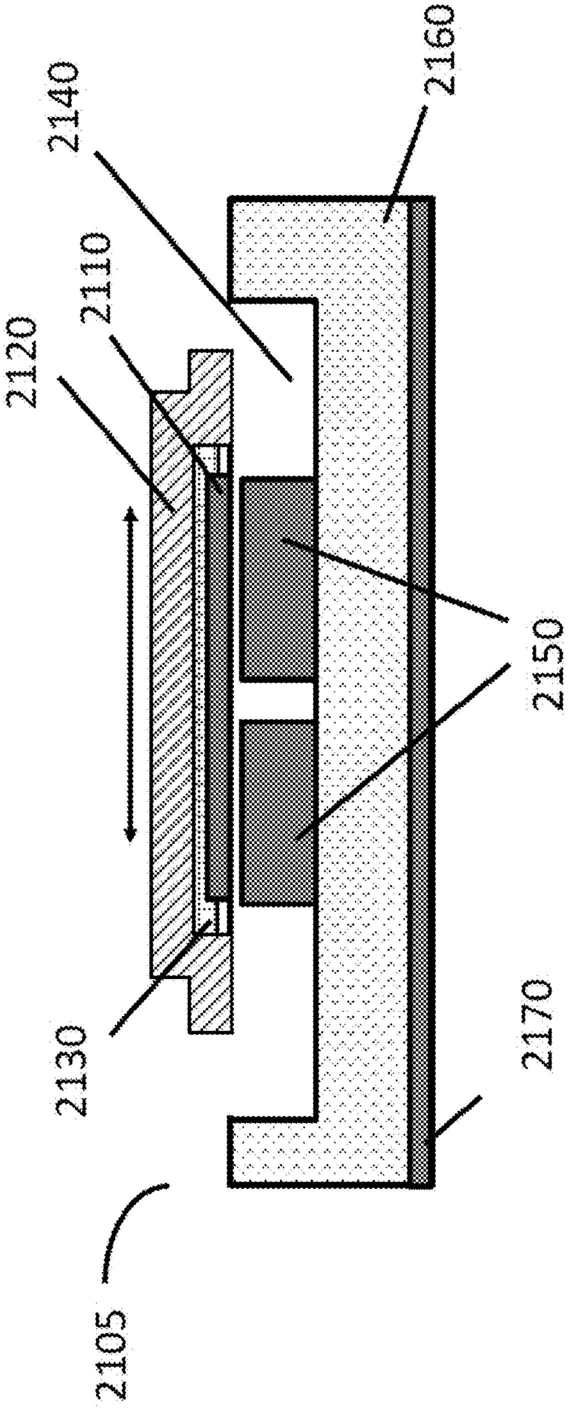

Inductive tuning of resonators is described as another embodiment of the present work. FIGS. 21A-B show an embodiment employing inductive tuning to alter the resonance frequency of electromagnetic resonator 2150.

FIG. 21A shows a tunable electromagnetic split ring resonator (SRR) 2150 connected in series with a transmission line 2103 to form a tunable filter 2100. The tunable filter 2100 has an input port 2101 and output port 2102. Inductive tunability of the electromagnetic split ring resonator 2150 including an isolated conductor or semiconductor and actuator mechanism is represented by the dotted loop outline 2110. The tunable filter 2100 in one embodiment provides a single tunable resonance peak, and when combined with passive filter elements including capacitors, resistors, inductors, and other resonators, comprises a tunable band pass filter. Inductive tuning of resonator 2150 is achieved by actuation of a mechanical actuator to move material 2110 with respect to the inductive portion of resonator 2150. In one example, the motion is in the direction of the double ended arrow in FIG. 21A. Other directions of mechanical motion of material 2110 with respect to resonator 2150 are known to those skilled in the art and are comprehended within the scope of this work.

FIG. 21B shows a cross section of a tunable resonator embodiment through dotted line A-B depicted in FIG. 21A. The tunable filter element 2105 comprises an isolated conductor or semiconductor material 2110, mechanical actuator 2120, electrical isolation layer 2130, cavity 2140, low-loss substrate 2160, electrical ground plane 2170, and shows a cross section of the inductive ends of an electromagnetic resonator 2150. In one embodiment, the actuator 2120 is a piezoelectric material which moves in response to an applied electric voltage, not shown. In another embodiment the actuator 2120 is a microelectromechanical (MEMS) support structure actuated electrostatically. Additional implementations of the actuator 2120 include magnetic actuation and thermal activation.

Figure 22:
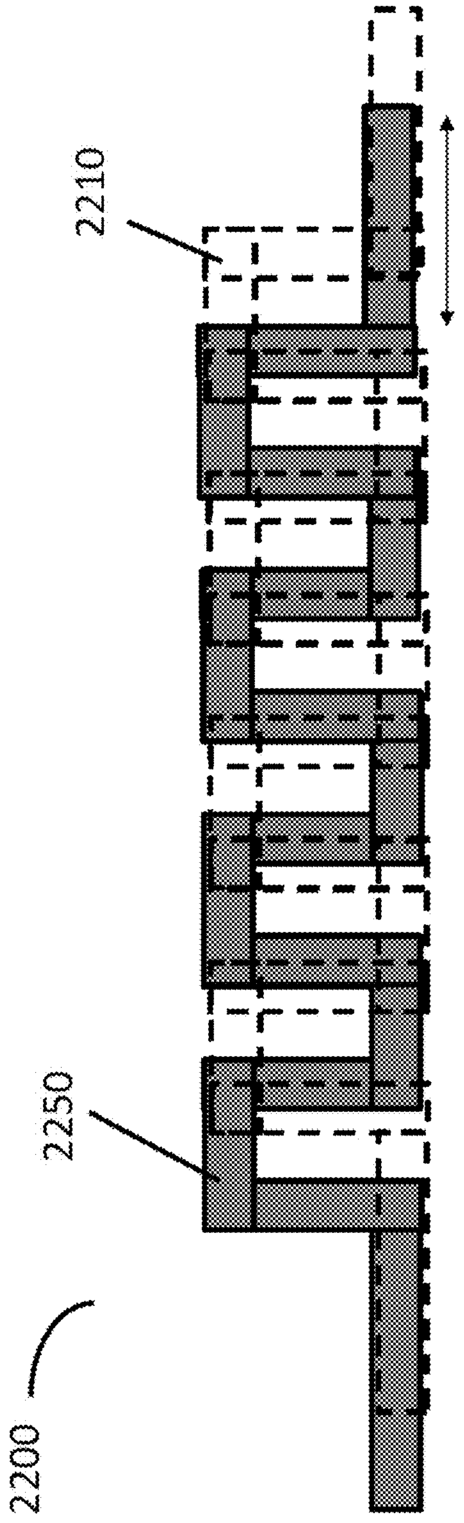
FIG. 22 shows an implementation of inductive tuning of a resonator element in another embodiment of the present work.

FIG. 22 shows another embodiment of inductive tuning of electromagnetic resonators in the present work. Inductive tuning element 2200 comprises at least one moveable isolated conductor or semiconductor material 2210 and a conducting loop element 2250. Movement of material 2210 is achieved through use of a mechanical actuator as described earlier (not shown). Inductive tuning element 2200 may be an inductive portion of an electromagnetic resonator or a subsection of a larger split ring resonator.

Figure 23:
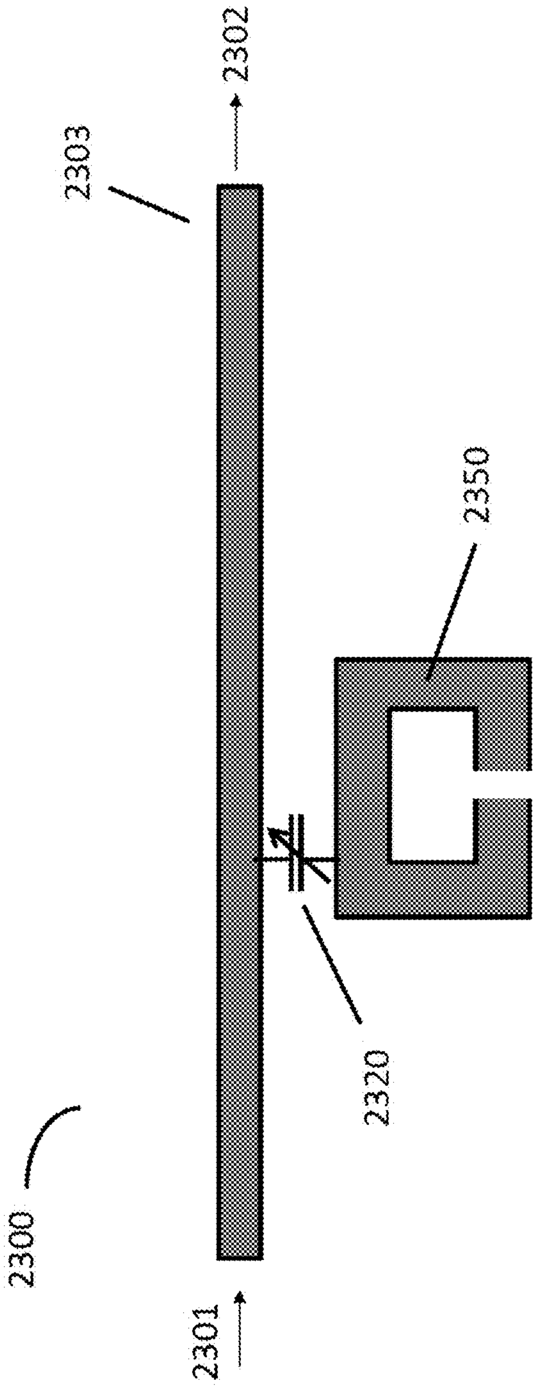
FIG. 23 depicts tuning of electromagnetic coupling between a transmission line and resonator element in one embodiment of the present work.

In other embodiments, the tunable isolated conductor or semiconductor element may be used to vary coupling between other filter components. FIG. 23 shows an electromagnetic split ring resonator (SRR) 2350 coupled to a transmission line 2303 with variable capacitor 2320 to form a tunable filter 2300. The tunable filter 2300 has an input port 2301 and output port 2302. Tunability of coupling between the transmission line 2303 and the electromagnetic split ring resonator 2350 is represented by the tunable capacitor symbol 2320, which includes an isolated conductor or semiconductor and actuator mechanism. In general, the coupling between electromagnetic resonator 2350 and transmission line 2303 involves both electric and magnetic coupling, and may be tuned through either or both electric or magnetic tuning or both, but is here represented by a tunable capacitor symbol 2320. The tunable filter 2300 in one embodiment provides a single tunable resonance notch or single tunable transmission minimum. The magnitude or depth of the notch can be varied by tuning element 2320 through mechanical actuation of an actuator. While FIG. 23 shows one embodiment, the tunable filter 2300 may be combined with other tunable resonators and with passive filter elements including capacitors, resistors, inductors, and other resonators within the scope of the present work.

Figure 24:
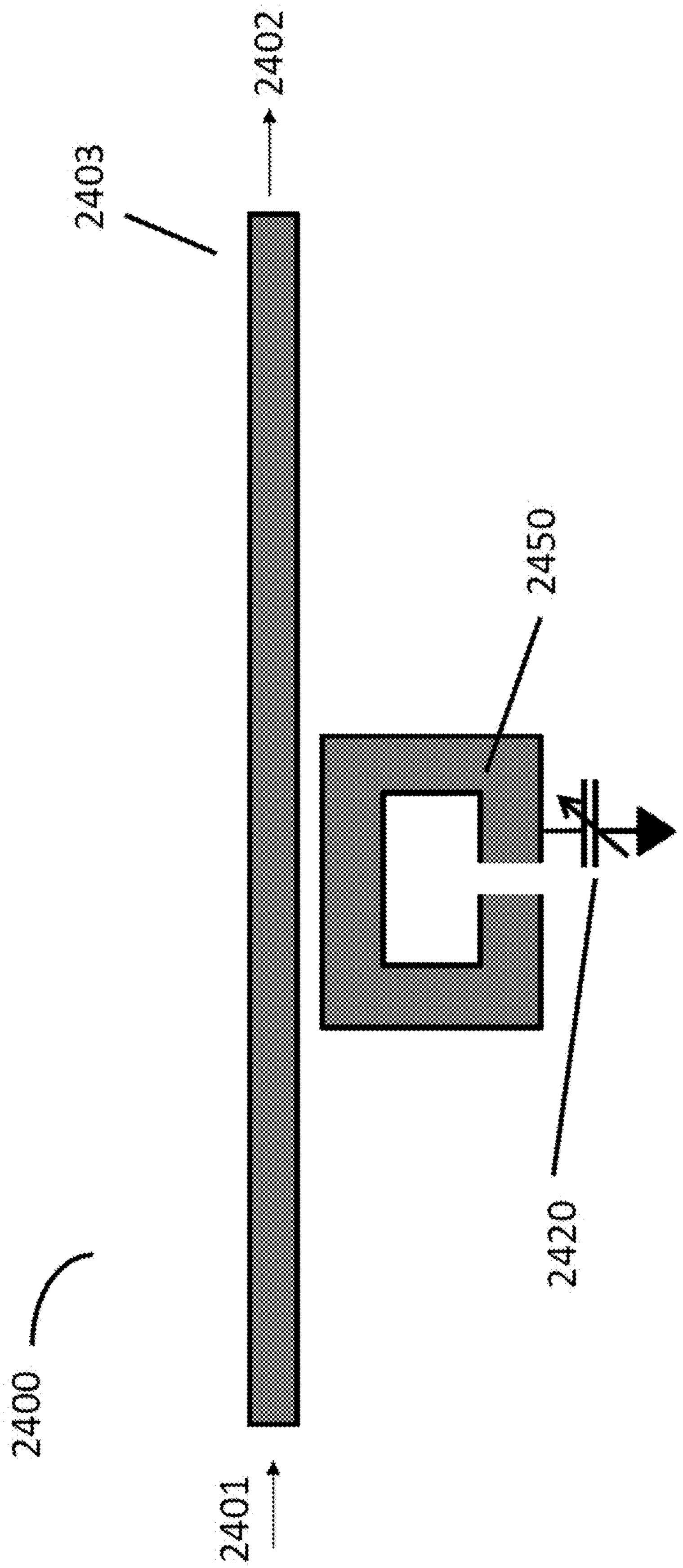
FIG. 24 depicts tuning of electromagnetic coupling between a resonator element and ground in another embodiment of the present work.

In another embodiment, FIG. 24 shows a transmission line 2403 coupled to an electromagnetic split ring resonator (SRR) 2450 with variable (and tunable) coupling to ground (represented by tunable capacitor symbol 2420) to form a tunable filter 2400. The tunable filter 2400 has an input port 2401 and output port 2402. Tunability of coupling between the electromagnetic split ring resonator and ground is represented by the tunable capacitor symbol 2420 which includes an isolated conductor or semiconductor and actuator mechanism. In general, the coupling between electromagnetic resonator 2450 and ground involves both electric and magnetic coupling, and may be tuned through either or both electric or magnetic tuning or both, but is here represented by a tunable capacitor symbol 2420. The tunable filter 2400 in one embodiment provides a single tunable resonance trough or notch in transmission, and comprises a tunable band stop or tunable notch filter. While FIG. 24 shows one embodiment, the tunable filter 2400 may be combined with other tunable resonators and with passive filter elements including capacitors, resistors, inductors, and other resonators within the scope of the present work.

Figure 25:
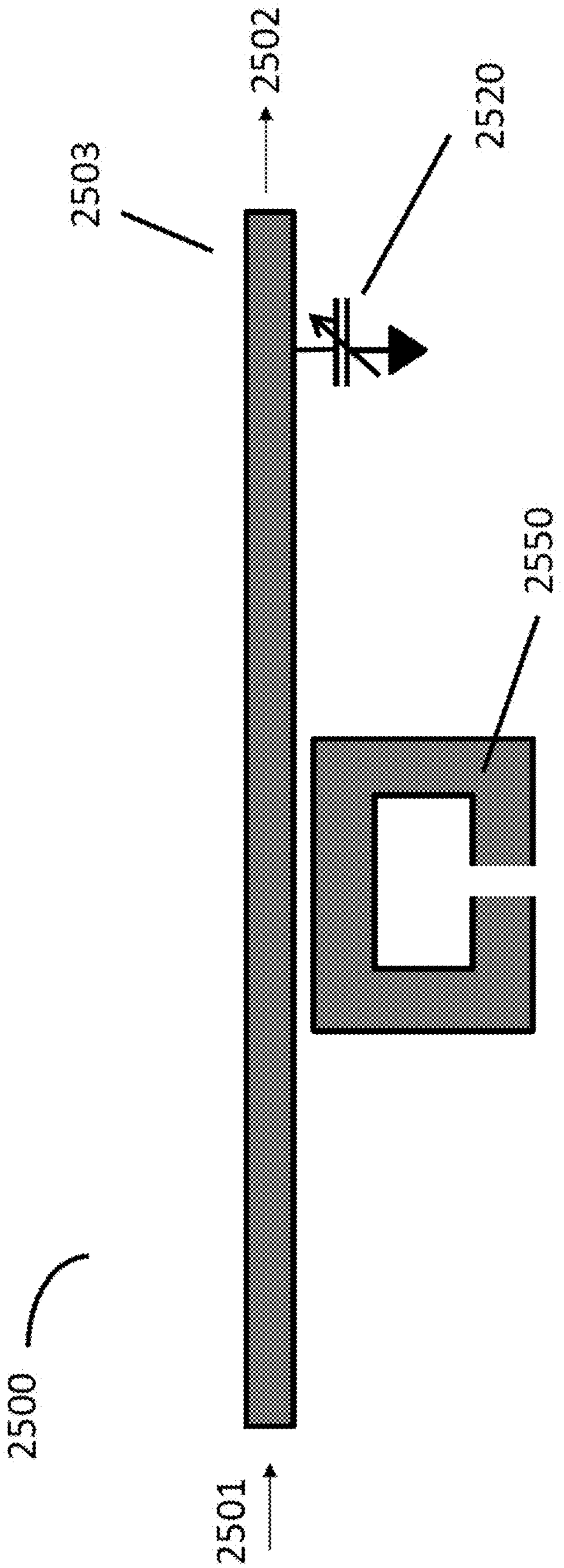
FIG. 25 depicts tuning of electromagnetic coupling between a transmission line and ground in one embodiment of the present work.

In another embodiment, FIG. 25 shows an electromagnetic split ring resonator (SRR) 2550 coupled to transmission line 2503 with variable coupling to ground represented by tunable capacitor symbol 2520 to form a tunable filter 2500. The tunable filter 2500 has an input port 2501 and output port 2502. Tunability of coupling between the transmission line 2503 and ground is represented by the tunable capacitor symbol 2520 which includes an isolated conductor or semiconductor and actuator mechanism.

Exemplary Tunable Antennas

In another embodiment of the present work, tunable antennas are disclosed. In one embodiment, a tunable antenna consists of an antenna feed line, an input/output port, at least one electromagnetic resonator, and a tunable actuator that couples electromagnetically to at least one electromagnetic resonator. The tunable actuator comprises a support structure, an isolated conductor or semiconductor material, and a capability for actuating movement of the isolated conductor or semiconductor with respect to at least one electromagnetic resonator.

A tunable antenna may contain multiple electromagnetic resonators, tuned to resonate at different frequencies of interest. Tunable MEMS actuators can be configured, for example, across the capacitive ends of electromagnetic resonators, providing suppression of resonance and signal detection with actuators close to the resonators, and enabling resonance for a selected frequency by moving the actuator away from a given resonator. By tuning and filtering antenna elements when receiving or transmitting, more separate signals may be received or sent at the same time, allowing greater multiple input, multiple output (MIMO) usage. Tunable antennas as described in this work allow for separate tuning of signal phase at each array element, enabling beam steering of signals and use of multiple beams at the same time. The tunable array elements described using metamaterial ring resonators are electrically small, improve antenna efficiency and allow for higher power usage than other technologies.

Figure 26A:
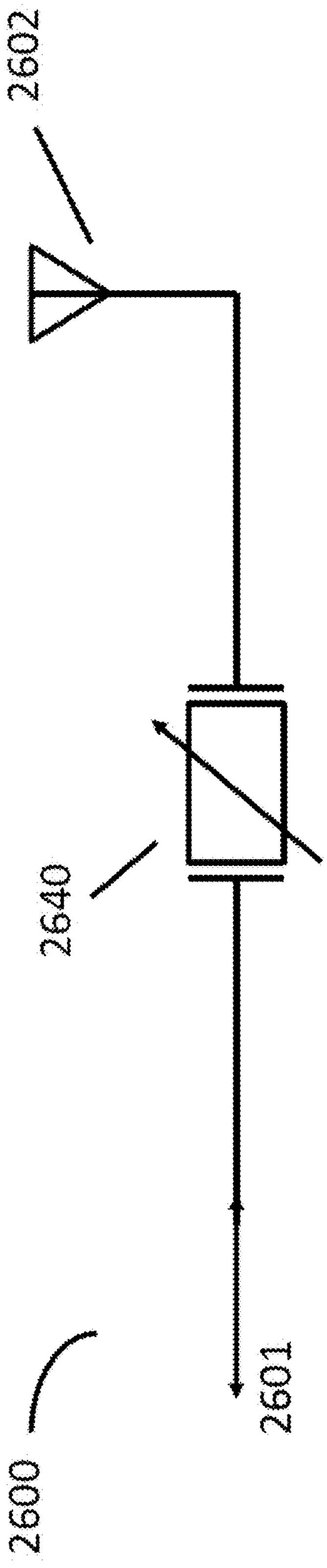
FIGS. 26A-B show implementations of tunable antennas in various embodiments of the present work.
Figure 26B:
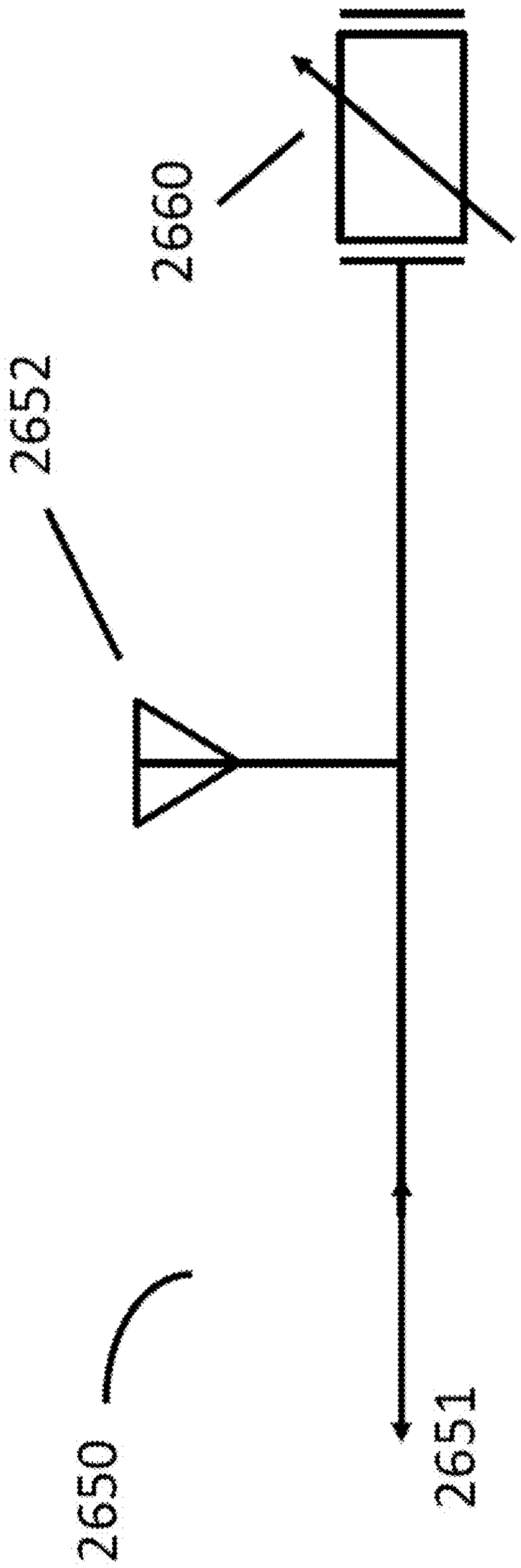

Tunable electromagnetic resonators as described in this work may be used as tunable antennas or connected to other antennas to enable antenna tuning and signal filtering of targeted frequencies. FIGS. 26A-B show two embodiments or configurations of tunable antennas or tunable antenna circuits. In FIG. 26A, the tunable antenna circuit 2600 comprises an antenna feed line 2601 coupled or connected to tunable resonator 2640, which is in turn coupled or connected to antenna 2602. FIG. 26B shows a tunable antenna circuit 2650, in which antenna feed line 2651 connects to antenna 2652 and then couples or connects to tunable resonator 2660. Resonator tuning of antennas as depicted in FIGS. 26A-B can improve antenna efficiency, increase signal power at desired transmission or receiving frequencies, and filter out electromagnetic noise and frequencies outside of a target range of frequencies.

Figure 27:
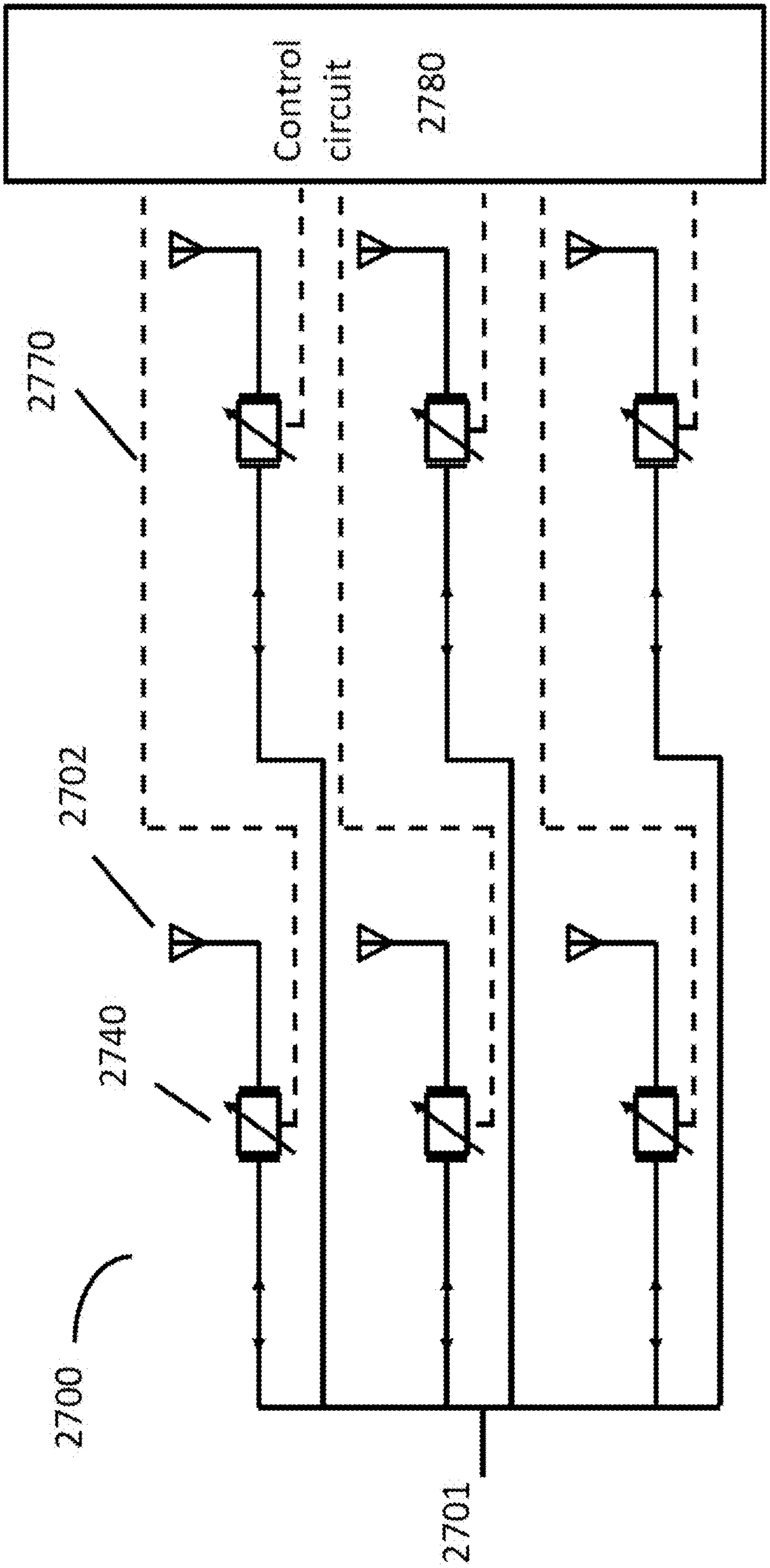
FIG. 27 shows an array of tunable antennas connected to control circuits in one embodiment of the present work.

Electromagnetic resonators such as split ring resonators and complementary split ring resonators can be made electrically small, in which the size of the resonator is significantly smaller than a half wavelength of resonant frequencies. Using small, tunable electromagnetic resonators is advantageous in many applications, particularly those like phased array antennas where antenna elements are spaced closed together. FIG. 27 shows a schematic implementation 2700 of an array of tunable antenna elements comprising antenna feed line 2701, tunable electromagnetic resonators 2740 as described in this work, antenna ends 2702, control circuitry 2780 and tuning control lines 2770. In some embodiments the electromagnetic resonators 2740 may also be the antenna end radiating elements. The array circuit described provides for selective filtering of multiple different frequencies simultaneously, enabling greater multiple input, multiple output (MIMO) usage. Multiple signals at different frequencies can be initiated simultaneously through antenna feed line 2701, while the control circuit 2780 and control lines 2770 communicate which target frequencies to filter for each antenna array element, allowing multiple frequency transmission from the antenna array simultaneously. Tuning of electromagnetic resonators as described in this work also enables tuning of signal phase for each element and target frequency. The tunable antenna array 2700 can provide for both phased array signaling and beam steering through control of signal phase as well as initiation of signal transmission or receipt of signals at multiple frequencies. While FIG. 27 shows one embodiment of a tunable antenna array using tunable electromagnetic resonators as described in this work, other implementations may readily be made by those skilled in the art within the scope of this work.

An Exemplary Method

The present invention further relates to a method, comprising receiving an incoming signal on at least one conducting transmission line through an input port, coupling the incoming signal to at least one electromagnetic resonator in electrical communication with the conducting transmission line(s), capacitively or inductively coupling at least one mechanical actuator tuning element to the electromagnetic resonator(s), preventing one or more electrically isolated conductors or semiconductor materials (in the mechanical actuator tuning element[s]) from contacting the electromagnetic resonator with a mechanical support structure that supports the mechanical actuator tuning element(s), and providing an output signal from the electromagnetic resonator(s) through at least one output port in electrical communication with the conducting transmission line(s). Of course, the method may use multiple transmission lines, multiple electromagnetic resonators, multiple mechanical actuator tuning elements, and/or multiple mechanical support structures as described herein. Thus, in further embodiments, the electromagnetic resonator may comprise a split ring resonator (SRR), a complementary split ring resonator (CSRR), a combline resonator, a hairpin resonator, an edge-coupled resonator, a step impedance resonator, a spur line resonator, or a combination thereof, as described above. Alternatively, or additionally, the conducting transmission line(s), the electromagnetic resonator(s) and/or the electrically isolated conductor material(s) may independently comprise a superconducting material.

In a further embodiment, capacitively or inductively coupling the mechanical actuator tuning element(s) to the electromagnetic resonator(s) may provide a predetermined phase shift or delay of the incoming signal. The incoming signal may have a frequency of 1-125 GHz. In other or further specific implementations, capacitively or inductively coupling the mechanical actuator tuning element(s) to the electromagnetic resonator(s) may comprise piezoelectrically, electrostatically, magnetically, thermally, pneumatically or hydraulically actuating the mechanical actuator tuning element(s). Such actuation of the mechanical actuator tuning element(s) varies the capacitance or inductance between the electrically isolated conductor(s) or semiconductor material(s) and the electromagnetic resonator(s), thus tuning the capacitance or inductance to result in the desired phase shift or delay of the incoming signal.

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A tunable electromagnetic filter, comprising:

a) at least one conducting transmission line, b) at least one input port in electrical communication with the at least one conducting transmission line, c) at least one output port in electrical communication with the at least one conducting transmission line, d) a plurality of electromagnetic resonators in electrical communication with the at least one conducting transmission line, e) a plurality of independently actuatable mechanical actuator tuning elements, wherein each of the plurality of mechanical actuator tuning elements comprises an electrically isolated conductor or semiconductor material that couples capacitively or inductively to a corresponding one of the plurality of electromagnetic resonators and varies a capacitance or inductance between the electrically isolated conductor or semiconductor material and the corresponding one of the electromagnetic resonators by piezoelectric actuation, electrostatic actuation, magnetic actuation, thermal actuation, pneumatic actuation, or hydraulic actuation, and f) at least one mechanical support structure supporting the plurality of mechanical actuator tuning elements and preventing the plurality of mechanical actuator tuning elements from contacting the plurality of electromagnetic resonators.

2. The tunable electromagnetic filter of claim 1, wherein each of the plurality of electromagnetic resonators comprises a split ring resonator (SRR), a complementary split ring resonator (CSRR), a combline resonator, an edge-coupled resonator, a step impedance resonator, a spur line resonator, or a combination thereof.

3. The tunable electromagnetic filter of claim 1, wherein the at least one conducting transmission line, the plurality of electromagnetic resonators or the electrically isolated conductor material comprises a superconducting material.

4. The tunable electromagnetic filter of claim 1, wherein the plurality of mechanical actuator tuning elements comprises (i) a first mechanical actuator tuning element having a first capacitance or inductance tuned to provide a first predetermined phase shift or delay of an incoming signal and (ii) a second mechanical actuator tuning element having a second capacitance or inductance tuned to provide a second predetermined phase shift or delay of the incoming signal.

5. The tunable filter of claim 4, wherein the at least one conducting transmission line is configured to receive the incoming signal, and the incoming signal has a frequency of 1-125 GHz.

6. The tunable filter of claim 1, wherein the at least one mechanical support structure comprises a glass, high resistivity silicon, a suspended substrate integrated waveguide, or a low-loss dielectric material.

7. The tunable filter of claim 1, wherein the electrically isolated conductor or semiconductor material and the corresponding one of the electromagnetic resonators have a relatively close proximity and relatively strong coupling in an 'off' state, thereby lowering a resonant frequency of and suppressing resonance with the corresponding one of the electromagnetic resonators, and a relatively greater distance and relatively weak coupling in an 'on' state, thereby increasing the resonant frequency of and enhancing resonance with the corresponding one of the electromagnetic resonators.

8. A tunable electromagnetic antenna, comprising:

a) a conducting antenna feed line, b) at least one input or output port, c) a plurality of electromagnetic resonators, d) a plurality of independently actuatable mechanical actuator tuning elements, wherein each of the plurality of mechanical actuator tuning elements comprises an electrically isolated conductor or semiconductor material that couples capacitively or inductively to a corresponding one of the plurality of electromagnetic resonators and varies a capacitance or inductance between the electrically isolated conductor or semiconductor material and the corresponding one of the electromagnetic resonators by piezoelectric actuation, electrostatic actuation, magnetic actuation, thermal actuation, pneumatic actuation, or hydraulic actuation, and e) at least one mechanical support structure that supports the plurality of mechanical actuator tuning elements and prevents the electrically isolated conductor or semiconductor material from contacting the plurality of electromagnetic resonators.

9. The tunable electromagnetic antenna of claim 8, wherein the electromagnetic resonator comprises a split ring resonator (SRR), a complementary split ring resonator (CSRR), a combline resonator, an edge-coupled resonator, a step impedance resonator, a spur line resonator, or a combination thereof.

10. The tunable electromagnetic antenna of claim 8, wherein the conducting antenna feed line, the at least one electromagnetic resonator or the electrically isolated conductor material comprises a superconducting material.

11. The tunable electromagnetic antenna of claim 8, wherein the plurality of mechanical actuator tuning elements comprises (i) a first mechanical actuator tuning element having a first capacitance or inductance configured to provide a first predetermined phase shift or delay of an incoming signal and (ii) a second mechanical actuator tuning element having a second capacitance or inductance tuned to provide a second predetermined phase shift or delay of the incoming signal.

12. The tunable electromagnetic antenna of claim 8, further comprising a plurality of mechanical actuators corresponding to and tuned by the plurality of mechanical actuator tuning elements.

13. An array of the tunable electromagnetic antennas of claim 12, comprising:

a) two or more of the tunable electromagnetic antennas, b) control circuitry that tunes a frequency or signal phase or delay of the input signal, c) antenna feed lines, and d) at least one control line corresponding to each of the tunable electromagnetic antennas, connected to each of the plurality of mechanical actuators.

14. The array of claim 13, wherein the at least one input port or at least one of the antenna feed lines is configured to receive an incoming signal having a frequency of 1-125 GHz.

15. The tunable electromagnetic antenna of claim 8, wherein the at least one mechanical support structure comprises a glass, high resistivity silicon, a suspended substrate integrated waveguide, or a low-loss dielectric material.

16. The tunable electromagnetic antenna of claim 8, wherein the plurality of mechanical actuator tuning elements comprises (i) a first mechanical actuator tuning element having a first capacitance or inductance that provides a first predetermined phase shift or delay of an incoming signal and (ii) a second mechanical actuator tuning element having a second capacitance or inductance that provides a second predetermined phase shift or delay of the incoming signal.

17. A method, comprising:

a) receiving an incoming signal on at least one conducting transmission line through an input port, b) coupling the incoming signal to a plurality of electromagnetic resonators in electrical communication with the at least one conducting transmission line, c) independently setting a position of each of a plurality of mechanical actuator tuning elements with respect to the plurality of electromagnetic resonators, each of the plurality of mechanical actuator tuning elements comprising an electrically isolated conductor or semiconductor material that varies a capacitance or inductance between the electrically isolated conductor or semiconductor material and a corresponding one of the electromagnetic resonators by piezoelectric actuation, electrostatic actuation, magnetic actuation, thermal actuation, pneumatic actuation, or hydraulic actuation, d) preventing each of the electrically isolated conductor or semiconductor materials from contacting the plurality of electromagnetic resonators with at least one mechanical support structure that supports the plurality of mechanical actuator tuning elements, and e) providing an output signal from the plurality of electromagnetic resonators through at least one output port in electrical communication with the at least one conducting transmission line.

18. The method of claim 17, wherein the electromagnetic resonator comprises a split ring resonator (SRR), a complementary split ring resonator (CSRR), a combline resonator, an edge-coupled resonator, a step impedance resonator, a spur line resonator, or a combination thereof.

19. The method of claim 17, wherein the plurality of mechanical actuator tuning elements comprises (i) a first mechanical actuator tuning element that provides a first predetermined phase shift or delay of the incoming signal and (ii) a second mechanical actuator tuning element having a second capacitance or inductance that provides a second predetermined phase shift or delay of the incoming signal, and the incoming signal has a frequency of 1-125 GHz.

20. The method of claim 17, wherein setting the position of each of the plurality of mechanical actuator tuning elements comprises adjusting a distance of the plurality of mechanical actuator tuning elements to capacitive ends of the corresponding one of the electromagnetic resonators.

* * * * *